US012198095B2

(12) United States Patent
Trebaol et al.

(10) Patent No.: US 12,198,095 B2
(45) Date of Patent: Jan. 14, 2025

(54) METHOD AND SYSTEM FOR ACCURATELY ESTIMATING AMOUNT OF MATERIALS IN STORES

(71) Applicant: DataOnline, L.L.C., New Providence, NJ (US)

(72) Inventors: Theodore Trebaol, Fremont, CA (US); Louis Trebaol, Franklin, NH (US); Sourav Dey, South San Francisco, CA (US); Joshua Hayes, San Rafael, CA (US)

(73) Assignee: DataOnline, L.L.C., New Providence, NJ (US)

( * ) Notice: Subject to any disclaimer, the term of this patent is extended or adjusted under 35 U.S.C. 154(b) by 114 days.

(21) Appl. No.: 17/350,766

(22) Filed: Jun. 17, 2021

(65) Prior Publication Data

US 2021/0398062 A1 Dec. 23, 2021

Related U.S. Application Data

(60) Provisional application No. 63/040,759, filed on Jun. 18, 2020.

(51) Int. Cl.
*G06Q 10/00* (2023.01)
*G06F 30/20* (2020.01)
(Continued)

(52) U.S. Cl.
CPC .......... *G06Q 10/087* (2013.01); *G06F 30/20* (2020.01); *G06Q 10/063114* (2013.01); *G06Q 10/0639* (2013.01); *G06Q 10/08* (2013.01)

(58) Field of Classification Search
CPC ......... G06Q 10/087; G06Q 10/063114; G06Q 10/0639
See application file for complete search history.

(56) References Cited

U.S. PATENT DOCUMENTS 6,736,316 B2   5/2004   Neumark
7,953,839 B2   5/2011   Sim et al.
(Continued)

FOREIGN PATENT DOCUMENTS

WO   2012073044 A3   7/2012
WO   2012099588 A1   7/2012
(Continued)

OTHER PUBLICATIONS

"Rosemount TankMaster Inventory Management Software". Web Page <https://www.emerson.com/documents/automation/product-data-sheet-rosemount-tankmaster-en-us-29414.pdf>, retrieved on Aug. 30, 2021.
(Continued)

*Primary Examiner* — Rokib Masud
(74) *Attorney, Agent, or Firm* — Rita C. Chipperson; Chipperson Law Group, P.C.

(57) ABSTRACT

Systems, methods, and apparatus are disclosed for estimating quantities of stored materials in an unmonitored store. The data from a lower-fidelity store can be collected by a person (manual or "unmonitored" stores), which are manually collected unmonitored data, whereas monitored data from a higher-fidelity store can be collected by automated sensors from one or more similar stores ("monitored" stores). The present system may take as initial input historical data from a set of monitored stores and historical data for a set of manual stores. The system may continuously receive, over time, monitored data from monitored stores data and unmonitored data from manual stores. The system generates a model using the monitored data and the unmonitored data and applies the model to user-specified input data parameters to generate estimates of an inventory parameter, such as remaining material quantities in the set of manual unmonitored stores since their latest manual data collection.

23 Claims, 6 Drawing Sheets

(51) Int. Cl.
    *G06Q 10/0631*    (2023.01)
    *G06Q 10/0639*    (2023.01)
    *G06Q 10/08*    (2023.01)
    *G06Q 10/087*    (2023.01)

(56) References Cited

U.S. PATENT DOCUMENTS

| | | | |
|---|---|---|---|
| 8,341,106 | B1 | 12/2012 | Scolnicov et al. |
| 9,435,675 | B2 | 9/2016 | Wise |
| 9,811,103 | B2 | 11/2017 | Willig |
| 10,119,657 | B2 | 11/2018 | Suman |
| 10,533,709 | B2 | 1/2020 | Jacobsen et al. |
| 10,692,022 | B2 | 6/2020 | Alphenaar et al. |
| 11,003,974 | B2 | 5/2021 | Carr et al. |
| 2009/0037283 | A1 | 2/2009 | Anderson |
| 2011/0140850 | A1* | 6/2011 | Wassel .................. F17C 13/003 340/8.1 |
| 2012/0278129 | A1 | 11/2012 | Salomatin et al. |
| 2013/0293388 | A1 | 11/2013 | Ingalsbe et al. |
| 2016/0072287 | A1* | 3/2016 | Jia .......................... H02J 3/0073 700/295 |
| 2018/0234748 | A1* | 8/2018 | Haddy .................... G01F 23/22 |

FOREIGN PATENT DOCUMENTS

| | | |
|---|---|---|
| WO | 2019082185 A1 | 5/2019 |
| WO | 2020002688 A1 | 1/2020 |

OTHER PUBLICATIONS

International Search Report- PCT/US2021/038040, Dataonline, L.L.C. dated Oct. 7, 2021.

Written Opinion of the International Searching Authority (ISA)—PCT/US2021/038040, Dataonline, L.L.C. dated Oct. 7, 2021.

\* cited by examiner

METHOD AND SYSTEM FOR ACCURATELY ESTIMATING AMOUNT OF MATERIALS IN STORES

CROSS-REFERENCE TO RELATED APPLICATIONS

This application is a U.S. non-provisional patent application that claims the benefit of the U.S. provisional patent application entitled "Method And System For Accurately Estimating Amount Of Materials In Stores," having Ser. No. 63/040,759, filed Jun. 18, 2020, which is hereby incorporated by reference in its entirety as if fully set forth herein.

BACKGROUND OF THE INVENTION

Embodiments of the present invention relate to apparatus for, methods for, and systems for estimating inventory parameters, such as levels of units in storage or inventory. Exemplary embodiments of the present invention relate generally to inventory management systems and methods, and they include computer program products having unit status and consumption rate estimation features, possibly in combination with electronic monitoring via electronic sensors reporting digital data, which also may have analog features. One or more of the embodiments may include a fluid container adapted to contain a fluid and to measure a level of the fluid contained in the container, such as a propane or natural gas tank having an electronic sensor.

Material supply chains connect nodes of producers, distributors, vendors, and consumers, and such supply chains include material storage assets at each node. Material producers and distributors may enter into arrangements that guarantee a consumer's access to the materials by allowing the producers and distributors to control the schedule of interactions with the store (e.g., resupplying a desired quantity of the material in the store). In this situation, producers and distributors can choose to install remote sensors on stores that measure and report material quantities, so that interactions with the store may be scheduled to adequately manage the store (e.g., ensuring the store does not run out of material in inventory). Directly measuring a store can result in the most efficient supply chain.

For example, U.S. Patent Publication US 2013/0293388 A1 is titled "Cellular Tank Monitoring Technology" and discloses monitoring the status and use of an LP fuel tank using cellular communication technology. Such a system includes a sensor unit, a remote host unit, and a base unit. The sensor unit is communicatively connected to a storage tank, measures the level of fluid in the storage tank, and transmits fluid level data externally via a cellular data communication link. The remote host unit is disposed remotely from the storage tank and receives fluid level data from the sensor unit via the cellular data communication link. The base unit is disposed in the vicinity of the storage tank by a user and receives fluid level data from the sensor unit via the cellular data communication link or via an RF link.

Likewise, U.S. Pat. No. 10,552,721 B2 is titled "Method and a System for Monitoring a Quantity Related to an Asset" and discloses a method for automatically electronically associating vessel identity information of a vessel with an unassociated telemetric device. The unassociated telemetric device comprises a processor and is configured to detect and transmit quantity or usage data, is configured with a location sensing device, and is configured to communicate with a remote server. The method begins with the remote server receiving the vessel identity information comprising a deployment location for the unassociated telemetric device. The method continues with the unassociated telemetric device operating in accordance with an automatic action rule. In response to the unassociated telemetric device operating in accordance with the automatic action rule, the method proceeds with the processor receiving location information of the unassociated telemetric device from the location sensing device. The method continues with the unassociated telemetric device transmitting the location information; the remote server receiving the location information; and the remote server correlating the location information with the vessel identity information. Then, when resolving that the location information represents that the unassociated telemetric device is within a proximity to the deployment location, the method continues with the remote server automatically electronically associating the unassociated telemetric device with the vessel identity information. This results in the unassociated telemetric device becoming an associated telemetric device, so that when the associated telemetric device generates quantity or usage information, the quantity or usage information transmitted by the associated telemetric device is applied to a data store of the remote server related to the vessel identity information.

However, not all stores are or may be measured using sensors. Some stores are or need to be manually managed by the producers and distributors, such as when remote sensing is not an option. Furthermore, some consumers prefer to manage their own stores by manually requesting some or all interactions (e.g., storage asset maintenance or resupplying material). Producers and distributors may attempt to fit these requests into their service schedules as soon as possible, because any delays may negatively impact the consumer's access to materials. Inaccurately attempting to anticipate these consumer requests can lead to operating supply chains with unnecessarily excessive capacity.

BRIEF SUMMARY OF THE INVENTION

Briefly stated, in one aspect of the present invention, an exemplary system for estimating status, level, or consumption rate of units in storage or inventory includes at least one electronic sensor and at least one computer program product, adapted to process at least one dataset, and adapted to estimate an inventory level of an unmonitored store and/or to estimate a time at which an unmonitored store's inventory will be depleted. In another aspect of the present invention, an exemplary method of estimating status, level, or consumption rate of units in storage or inventory includes estimating an inventory level of an unmonitored store and/or estimating a time at which an unmonitored store's inventory will be depleted. In yet another aspect, an exemplary apparatus for estimating status, level, or consumption rate of units in storage or inventory includes a computer program product adapted to execute instructions for processing of data relating to inventory levels and times to generate estimated inventory levels and/or depletion dates of an unmonitored store.

In accordance with a first aspect of the present invention, an exemplary embodiment includes a system for estimating inventory parameters, such as store status, available store capacity, inventory status, inventory levels, inventory depletion dates, inventory depletion rates, and inventory consumption rates, of units in storage or inventory in a store. An exemplary system comprises a system for estimating an inventory parameter of an unmonitored store based on a correlation between a corresponding time and a corresponding inventory level of the unmonitored store as of the corresponding time. The exemplary system comprises a monitoring sensor and a computer program product. The monitoring sensor is adapted for use at a monitored store, wherein the monitoring sensor is an electronic sensor adapted to generate monitored data in a digital format, wherein the monitored data indicate an inventory level measurement at a measurement time for the monitored store; and wherein the electronic sensor is adapted to communicate via a communication device that is adapted to transmit the monitored data from the electronic sensor to a computing device. The computer program product is adapted to be stored on a non-transitory machine-readable medium of the computing device and includes computer instructions that are executable using a processor of the computing device that, when executed by the processor, cause the processor to execute a computer-implemented method for estimating the correlation between the corresponding time and the corresponding inventory level of the unmonitored store as of the corresponding time. The computer-implemented method includes capabilities of: receiving monitored data generated using the monitoring sensor providing the inventory level measurement at the measurement time for the monitored store; receiving unmonitored data associated with the unmonitored store, wherein the unmonitored data indicate a historical corresponding inventory level as of a historical corresponding time for the unmonitored store; generating a model to estimate the correlation between the corresponding inventory level and the corresponding time of the unmonitored store based at least on the monitored data and the unmonitored data; estimating the correlation between the corresponding inventory level and the corresponding time for the unmonitored store based on the model; and estimating the inventory parameter of the unmonitored store based on the model. The action of estimating the inventory parameter of the unmonitored store includes using the correlation between the corresponding inventory level and the corresponding time of the unmonitored store to estimate a corresponding inventory level estimate of the unmonitored store for a specified time, to estimate a corresponding time estimate for a specified inventory level of the unmonitored store, or to estimate the corresponding inventory level estimate for the specified time and to estimate the corresponding time estimate for the specified inventory level. The monitored store and the unmonitored store share similarities in store configuration, store inventory, and inventory depletion, whereby these similarities enable the unmonitored store to be compared with the monitored store for purposes of estimating the inventory parameter of the unmonitored store, in which a measured inventory parameter of the monitored store may be extrapolated or interpolated to generate an estimated inventory parameter of the unmonitored store. The monitored store comprises a store that includes the monitoring sensor. The unmonitored store comprises a store that does not include an electronic sensor adapted to generate the unmonitored data and transmit the unmonitored data to the computing device. The unmonitored data are not generated by an electronic sensor in communication with the computing device and transmitted to the computing device.

In accordance with a second aspect of the present invention, another exemplary embodiment includes a method of estimating inventory parameters, such as store status, available store capacity, inventory status, inventory levels, inventory depletion dates, inventory depletion rates, and inventory consumption rates, of units in storage or inventory in a store. An exemplary method comprises a method for estimating an inventory parameter of an unmonitored store based on a correlation between a corresponding time and a corresponding inventory level of the unmonitored store as of the corresponding time. The exemplary method comprises communicating with a monitoring sensor adapted for use at a monitored store and executing a computer program product. The monitoring sensor is an electronic sensor adapted to generate monitored data in a digital format, wherein the monitored data indicate an inventory level measurement at a measurement time for the monitored store; and wherein the electronic sensor is adapted to communicate via a communication device that is adapted to transmit the monitored data from the electronic sensor to a computing device. The computer program product is adapted to be stored on a non-transitory machine-readable medium of the computing device and includes computer instructions that are executable using a processor of the computing device that, when executed by the processor, cause the processor to execute a computer-implemented method for estimating the correlation between the corresponding time and the corresponding inventory level of the unmonitored store as of the corresponding time. The computer-implemented method includes capabilities of: receiving monitored data generated using the monitoring sensor providing the inventory level measurement at the measurement time for the monitored store; receiving unmonitored data associated with the unmonitored store, wherein the unmonitored data indicate a historical corresponding inventory level as of a historical corresponding time for the unmonitored store; generating a model to estimate the correlation between the corresponding inventory level and the corresponding time of the unmonitored store based at least on the monitored data and the unmonitored data; estimating the correlation between the corresponding inventory level and the corresponding time for the unmonitored store based on the model; and estimating the inventory parameter of the unmonitored store based on the model. The action of estimating the inventory parameter of the unmonitored store includes using the correlation between the corresponding inventory level and the corresponding time of the unmonitored store to estimate a corresponding inventory level estimate of the unmonitored store for a specified time, to estimate a corresponding time estimate for a specified inventory level of the unmonitored store, or to estimate the corresponding inventory level estimate for the specified time and to estimate the corresponding time estimate for the specified inventory level. The monitored store and the unmonitored store share similarities in store configuration, store inventory, and inventory depletion, whereby these similarities enable the unmonitored store to be compared with the monitored store for purposes of estimating the inventory parameter of the unmonitored store, in which a measured inventory parameter of the monitored store may be extrapolated or interpolated to generate an estimated inventory parameter of the unmonitored store. The monitored store comprises a store that includes the monitoring sensor. The unmonitored store comprises a store that does not include an electronic sensor adapted to generate the unmonitored data and transmit the unmonitored data to the computing device. The unmonitored data are not generated by an electronic sensor in communication with the computing device and transmitted to the computing device.

In accordance with a third aspect of the present invention, a further exemplary embodiment includes an apparatus for estimating inventory parameters, such as store status, available store capacity, inventory status, inventory levels, inventory depletion dates, inventory depletion rates, and inventory consumption rates, of units in storage or inventory in a store. An exemplary apparatus comprises a computer program product for estimating an inventory parameter of an unmonitored store based on a correlation between a corresponding time and a corresponding inventory level of the unmonitored store as of the corresponding time. The computer program product is adapted to be stored on a non-transitory machine-readable medium of a computing device. The computer program product comprises computer instructions that are executable using a processor of the computing device that, when executed by the processor, cause the processor to execute a computer-implemented method for estimating the correlation between the corresponding time and the corresponding inventory level of the unmonitored store as of the corresponding time. The computer-implemented method includes capabilities of: communicating with a monitored store having a monitoring sensor adapted for use at the monitored store, wherein the monitoring sensor is an electronic sensor adapted to generate monitored data in a digital format, wherein the monitored data indicate an inventory level measurement at a measurement time for the monitored store; and wherein the electronic sensor is adapted to communicate via a communication device that is adapted to transmit the monitored data from the electronic sensor to the computing device; receiving monitored data generated using the monitoring sensor providing the inventory level measurement at the measurement time for the monitored store; receiving unmonitored data associated with the unmonitored store, wherein the unmonitored data indicate a historical corresponding inventory level as of a historical corresponding time for the unmonitored store; generating a model to estimate the correlation between the corresponding inventory level and the corresponding time of the unmonitored store based at least on the monitored data and the unmonitored data; estimating the correlation between the corresponding inventory level and the corresponding time for the unmonitored store based on the model; and estimating the inventory parameter of the unmonitored store based on the model. The action of estimating the inventory parameter of the unmonitored store includes using the correlation between the corresponding inventory level and the corresponding time of the unmonitored store to estimate a corresponding inventory level estimate of the unmonitored store for a specified time, to estimate a corresponding time estimate for a specified inventory level of the unmonitored store, or to estimate the corresponding inventory level estimate for the specified time and to estimate the corresponding time estimate for the specified inventory level. The monitored store and the unmonitored store share similarities in store configuration, store inventory, and inventory depletion, whereby these similarities enable the unmonitored store to be compared with the monitored store for purposes of estimating the inventory parameter of the unmonitored store, in which a measured inventory parameter of the monitored store may be extrapolated or interpolated to generate an estimated inventory parameter of the unmonitored store. The monitored store comprises a store that includes the monitoring sensor. The unmonitored store comprises a store that does not include an electronic sensor adapted to generate the unmonitored data and transmit the unmonitored data to the computing device. The unmonitored data are not generated by an electronic sensor in communication with the computing device and transmitted to the computing device.

In accordance with a fourth aspect of the present invention, an additional exemplary embodiment includes a method of estimating inventory parameters, such as store status, available store capacity, inventory status, inventory levels, inventory depletion dates, inventory depletion rates, and inventory consumption rates, of units in storage or inventory in a store. An exemplary method comprises a method for estimating an inventory parameter of an unmonitored store based on a correlation between a corresponding time and a corresponding inventory level of the unmonitored store as of the corresponding time. The exemplary method comprises communicating with a monitoring sensor adapted for use at a monitored store and executing a computer program product. The monitoring sensor is an electronic sensor adapted to generate monitored data in a digital format, wherein the monitored data indicate an inventory level measurement at a measurement time for the monitored store; and wherein the electronic sensor is adapted to communicate via a communication device that is adapted to transmit the monitored data from the electronic sensor to a computing device. The computer program product is adapted to be stored on a non-transitory machine-readable medium of the computing device and includes computer instructions that are executable using a processor of the computing device that, when executed by the processor, cause the processor to execute a computer-implemented method for estimating the correlation between the corresponding time and the corresponding inventory level of the unmonitored store as of the corresponding time. The computer-implemented method includes capabilities of: receiving monitored data generated using the monitoring sensor providing the inventory level measurement at the measurement time for the monitored store; receiving unmonitored data associated with the unmonitored store, wherein the unmonitored data indicate a historical corresponding inventory level as of a historical corresponding time for the unmonitored store; filtering the monitored data by a monitored data filter to remove any non-compliant monitored data that do not meet a monitored data filter requirement of the monitored data; providing to a computing environment any compliant monitored data, in which compliant monitored data comprise monitored data that pass the monitored data filter, after meeting each monitored data filter requirement, and after removing non-compliant monitored data; filtering the unmonitored data by an unmonitored data filter to remove any non-compliant unmonitored data that do not meet an unmonitored data filter requirement of the unmonitored data; providing to the computing environment any compliant unmonitored data, in which compliant unmonitored data comprise unmonitored data that pass the unmonitored data filter, after meeting each unmonitored data filter requirement, and after removing non-compliant unmonitored data; collecting the compliant monitored data and the compliant unmonitored data in the computing environment for purposes of comparing any non-blocked compliant monitored data and any non-blocked compliant unmonitored data; blocking comparison of a corresponding dataset of compliant monitored data and compliant unmonitored data by a blocking module in the computing environment, in which the blocking module blocks comparison of any blocked corresponding dataset of any blocked compliant unmonitored data and any blocked compliant unmonitored data that does not meet a blocking module requirement of the corresponding dataset of the compliant monitored data and the compliant unmonitored data, and in which the blocking module does not block comparison of any non-blocked corresponding dataset of any non-blocked compliant unmonitored data and any non-blocked compliant unmonitored data that does meet each blocking module requirement of the corresponding dataset of the compliant monitored data and the compliant unmonitored data; computing an overlapped event history as a factor of the correlation by a computation module in the computing environment, in which the overlapped event history is computed by comparing the non-blocked corresponding dataset of the non-blocked compliant monitoring data and the non-blocked compliant unmonitored data; storing each overlapped event history as overlapped event history data in an overlapped event history database in the computing environment, in which the overlapped event history data and the overlapped event history database are available for use in subsequent steps of the method, including any repeated steps of the method; generating a model to estimate the correlation between the corresponding inventory level and the corresponding time of the unmonitored store based at least on the overlapped event history data and on the non-blocked corresponding datasets of the non-blocked compliant monitored data and the non-blocked compliant unmonitored data; estimating the correlation between the corresponding inventory level and the corresponding time for the unmonitored store based on the model; and estimating the inventory parameter of the unmonitored store based on the model. The action of estimating the inventory parameter of the unmonitored store includes using the correlation between the corresponding inventory level and the corresponding time of the unmonitored store to estimate a corresponding inventory level estimate of the unmonitored store for a specified time, to estimate a corresponding time estimate for a specified inventory level of the unmonitored store, or to estimate the corresponding inventory level estimate for the specified time and to estimate the corresponding time estimate for the specified inventory level. The blocking module is adapted to confirm that the monitored store and the unmonitored store share similarities in store configuration, store inventory, and inventory events, whereby these similarities enable the unmonitored store to be compared with the monitored store for purposes of estimating the inventory parameter of the unmonitored store, in which a measured inventory parameter of the monitored store may be extrapolated or interpolated to generate an estimated inventory parameter of the unmonitored store. The monitored store comprises a store that includes the monitoring sensor. The unmonitored store comprises a store that does not include an electronic sensor adapted to generate the unmonitored data and transmit the unmonitored data to the computing device. The unmonitored data are not generated by an electronic sensor in communication with the computing device and transmitted to the computing device. In some embodiments, the computing environment comprises a parallelization employing parallel processing or distributed computing.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. The embodiments shown in the drawings are not necessary to scale, to shape, to form, or to size; they do not necessarily include all possible features in the depicted embodiments; and the positions and proportions of embodiments and features may vary. In the drawings.

DETAILED DESCRIPTION OF THE INVENTION

Figure 1:
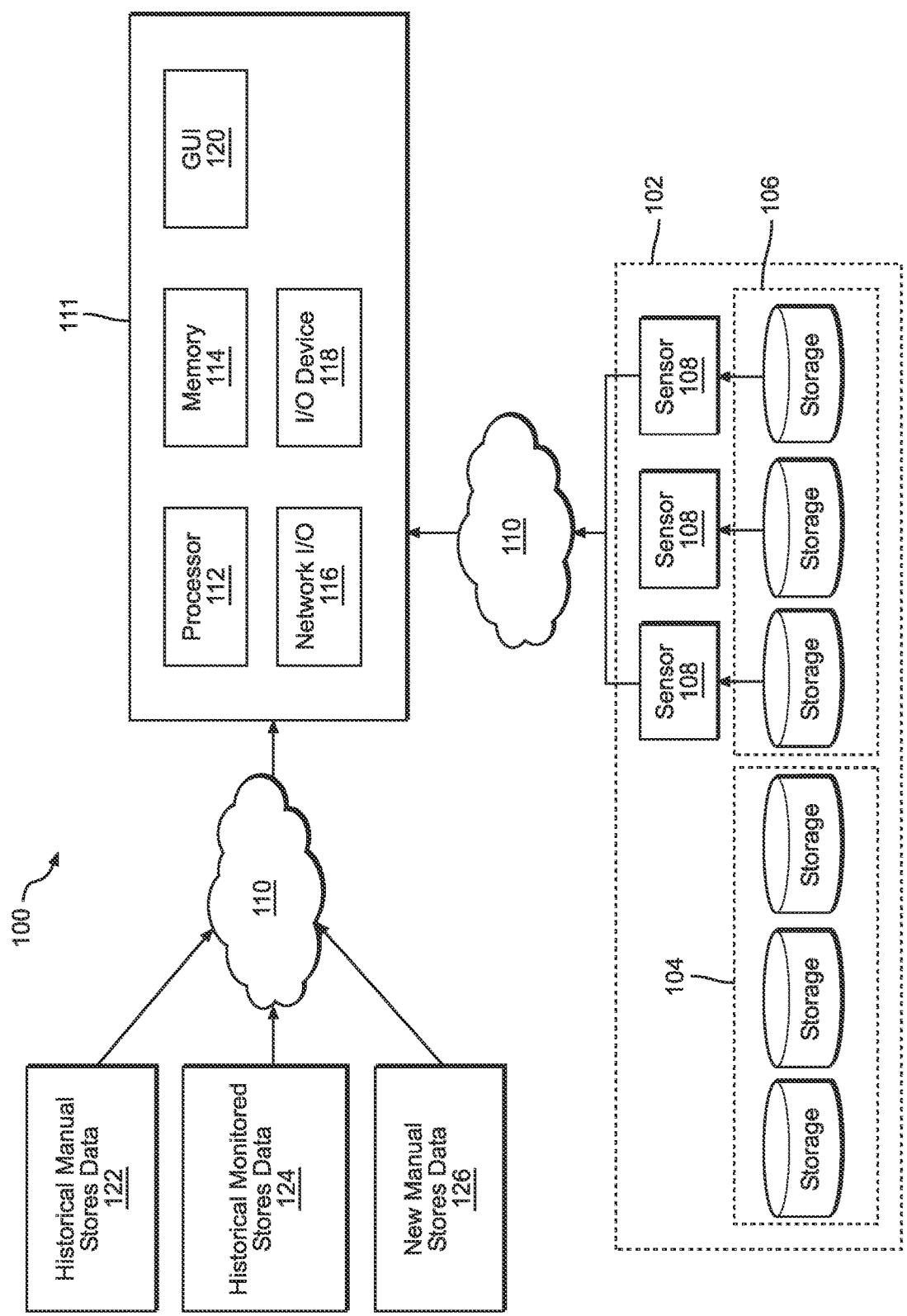
FIG. 1 depicts a block diagram of a multi-store monitoring environment, in accordance with one embodiment of the present invention.

Certain terminology may be used in the following description for convenience only and is not limiting. The words "lower" and "upper" and "top" and "bottom" designate directions in the drawings to which reference is made. The terminology includes the words above specifically mentioned, derivatives thereof and words of similar import.

Where a term is provided in the singular, the inventors also contemplate aspects of the invention described by the plural of that term. As used in this specification and in the appended claims, the singular forms "a", "an" and "the" include plural references unless the context clearly dictates otherwise, e.g., "a glove" may include a plurality of gloves, which may be the same, similar, interoperable, or matching, such as a matching pair of gloves (i.e., a right-hand glove and a left-hand glove, which are similar but different). Thus, for example, a reference to "a method" includes one or more methods, and/or steps of the type described herein and/or which will become apparent to those persons skilled in the art upon reading this disclosure.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods, constructs, and materials are now described. All publications mentioned herein are incorporated herein by reference in their entirety for all purposes. Where there are discrepancies in terms and definitions used in references that are incorporated by reference, the terms used in this application shall have the definitions given herein.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y.

Spatially relative terms, such as "beneath," "below," "lower," "above," "upper," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Similarly, references to times or measurements "of," "on," or "at" a point of reference may be synonymous as used in context.

Unless specifically stated otherwise, it may be appreciated that terms such as "processing," "computing," "calculating," "determining," or the like refer to the action and/or process of a computer or computing system, processor, central processing unit, loaded motherboard, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

As noted above, there are some non-trivial issues with monitoring multiple stores that include stores without automatic monitoring capability (e.g., via use of a sensor). As used herein, the term "monitored store" refers to a store that is monitored using a device (such as a sensor) that can automatically provide monitored data about the state of the store and/or inventory. The term "unmonitored store" or "manual store" refers to a store that is not automatically monitored, and thus unmonitored data collection regarding the state of the store is performed manually (e.g., manual inspection of the store or data received from the consumer about the state of the store). For instance, the distribution of fluid fuels, such as propane, commonly is performed by truck drivers driving tanker trucks that transport the fuel and refill the local stores. Likewise, these truck drivers typically conduct manual checks of the fuel levels in the stores when deploying the fuel product, record the fuel levels, and later report the fuel levels.

Nonetheless, although not reported in an automated fashion, as with the monitored data, unmonitored data may be entered into a computing device or other computer system, and thereafter digitally transmitted and received, even though the unmonitored data were not generated by an electronic sensor directly measuring an inventory parameter, such as a level of remaining inventory, and directly transmitted in an automated fashion. Indeed, unmonitored data even may include inventory parameter data directly measured by an electronic sensor that is not digitally connected to and/or communicating with a remote data collection computing device, and/or polled in an automated fashion to collect and/or report the unmonitored data, for use with estimating an inventory parameter in the present invention. For instance, a remote store may comprise a fuel storage tank having an electronic sensor as a fuel gauge, for which the fuel level may be downloaded digitally as unmonitored data locally using a portable computing device communicating locally with the sensor, after which the unmonitored data may be uploaded from the portable computing device to a networked computing device for transmission to and/or use by a computer program product that receives the unmonitored data and uses the unmonitored data as historical input in estimating a future inventory parameter.

In some cases, producers and/or distributors of a store's material may manually collect data from the unmonitored stores via personal inspection or requests to the consumer for the data. Material consumption models can be designed based on the manually collected data to attempt to estimate future or current inventory levels in the store. Such models can include constant consumption models, seasonal consumption models, or environmentally driven consumption models (e.g., attempting to estimate heating fuel consumption from a tank using weather information measured in the vicinity of the consumer). However, such current estimation techniques can result in supply chains serving manual stores that are either less efficient than those serving monitored stores or materials being depleted before they can be resupplied.

Accordingly, systems and methods are disclosed herein for providing more accurate models of the inventory levels of unmonitored stores. According to some embodiments, methods described herein combine high-fidelity monitored stores data (e.g., from sensor readings) with manual stores data and generates accurate high-fidelity level estimates of manual stores to maximize the efficiency of managing all of the stores (e.g., monitored and unmonitored). The embodiments described herein provide an alternative solution to having to install a sensor on each store and allow material producers and/or distributors to install remote sensors on a subset of their total stores population, while virtually monitoring other manual stores to provide current estimates of the manual stores' levels with the same fidelity as a physical sensor. Embodiments of the present invention may allow for estimating inventory parameters, such as store status, available store capacity, inventory status, inventory levels, inventory depletion dates, inventory depletion rates, and inventory consumption rates, of units in storage or inventory, such as between manual inventory readings and recordings of an unmonitored store, as well as between automated measurements of a monitored store.

Some embodiments of the present disclosure provide a method and system for estimating inventory levels in infrequently monitored stores using data collected when interacting with these stores and data collected from other similar stores which are monitored with automated sensors. The provided inventory level estimates increase the amount of insight producers and distributors of materials have into their consumer markets. An example of clients that might apply the disclosed systems or methods include industrial chemical producers and distributors storing liquid or gas materials in tanks. In such an industry, materials are transported by vehicles from tanks at producer and distributor locations to tanks at consumer locations. A producer is more cost effective if the producer can avoid storing excess material between production and distribution. A distributor is more cost effective if the distributor can minimize the number of resources used to transport materials to consumer storage tanks. Accurate inventory level estimates enable such a distributor to use fewer vehicles and technicians, and for less time, to meet the same market demand. In some embodiments, different models can be created for different time periods, such as different seasons. For example, a first set of models may be used for particular stores during winter months while a second set of models may be used for the stores during the summer months. The different models can better reflect the different usage rates based on the weather and may be especially useful for stores that hold heating fuel, such as propane.

In an example embodiment, a method for estimating inventory level of an unmonitored store includes receiving first data from one or more sensors providing inventory levels of one or more monitored stores; receiving second data, which may comprise at least one of historical resupply times (e.g., dates and possibly times of day) and historical inventory level measurements of the unmonitored store; generating a model to estimate the inventory level of the unmonitored store based at least on the first data and the second data; and estimating a current inventory level for the unmonitored store based on the model.

In another example embodiment, a method for estimating a time at which an unmonitored store's inventory will be depleted includes receiving first data from one or more sensors providing inventory levels of one or more monitored stores; receiving second data associated with the unmonitored store, where the second data may include at least one of historical resupply times (e.g., dates and possibly times of day) and historical inventory level measurements of the unmonitored store; generating a model to estimate the time at which the unmonitored store's inventory will be depleted based at least on the first data and the second data; and estimating the time at which the unmonitored store's inventory will be depleted based on the model.

The methods described herein may be applied to situations beyond fluid monitoring. According to some embodiments, the monitoring methods disclosed herein may be applied to any measurable inventory, such as, for example, boxes on grocery store shelves or merchandise at any store. The techniques may be embodied in devices, systems, methods, or machine-readable mediums, as will be appreciated.

Referring to FIG. 1, FIG. 1 depicts an example monitoring environment 100. Monitoring environment includes a plurality of stores 102 made up of unmonitored stores 104 and monitored stores 106. Each of the stores in plurality of stores 102 can include any quantifiable material as inventory, such as any fluid fuel, any liquid, any gas, or any objects (e.g., consumer products). Some example materials to be held within the stores include liquid nitrogen, oxygen, propane, natural gas, oil, etc. The stores 102 themselves can be any size and do not all have to be the same size. The unmonitored stores 104 and the monitored stores 106 share similarities in store configuration, store inventory, and inventory depletion, whereby these similarities enable the unmonitored stores 104 to be compared with the monitored stores 106 for purposes of estimating an inventory parameter of the unmonitored stores 104, in which a measured inventory parameter of the monitored stores 106 may be extrapolated or interpolated to generate an estimated inventory parameter of the unmonitored stores 104. However, the existence of the similarities does not mean or imply that each store 102 uses, depletes, receives, or refills inventory at the same or equal rate or level as each other store 102, whether an unmonitored store 104 or a monitored store 106, although such sameness or equality actually may arise or exist in certain environments 100. Therefore, knowing the totals for an inventory parameter for the monitoring environment 100 as a whole does not necessarily permit accurately estimating an inventory parameter for a specific unmonitored store 104 by merely determining and assigning an average value of the inventory parameter, averaged across the environment 100 as a whole.

Likewise, although the unmonitored stores 104 and the monitored stores 106 share similarities sufficient to enable their comparison, the unmonitored stores 104 are not necessarily tied to the monitored stores 106 in any way that would force an unmonitored store 104 to act or react in tandem with a monitored store 106. For instance, embodiments of the present invention do not require that the unmonitored stores 104 be tied to the monitored stores 106, whereby an inventory parameter of a tied unmonitored store 104 necessarily equals approximately the corresponding inventory parameter of a tied monitored store 106.

Also, although the unmonitored stores 104 and the monitored stores 106 share similarities sufficient to enable their comparison, the unmonitored stores 104 are not necessarily part of a closed, collective whole system, for which the total usage and an inventory parameter are known apart from the individual stores 102. In the event that stores 102 are part of a closed system, in which the total usage and inventory parameters of the collective whole system are known apart, without having individually measured the usage and inventory parameters from each of the individual stores 102, then the subtotals of the usage and other inventory parameters of the collection of unmonitored stores 104 will equal the totals of the collective whole system minus the subtotals for the collection of the individually-measured monitored stores 106. However, even in a closed system as environment 100, deducing the subtotals for the collection of unmonitored stores 102 does not necessarily provide insight into or accurately estimate inventory parameters for a specific unmonitored store 102, if the stores 102 do not all have the same or equal inventory parameters that would permit averaging across the environment 100, as discussed above. As such, embodiments of the present invention do not require that an unmonitored store 104 be within a closed system with a monitored store 106, whereby an inventory parameter of an unmonitored store 104 necessarily equals approximately the corresponding inventory parameter of the closed system minus the individually-measured inventory parameter of the monitored store 106.

Each of monitored stores 106 includes an electronic sensor 108 that is used to collect information about the associated store, according to an embodiment. Sensor 108 may be an electronic sensor that measures an inventory level within the store and transmits this inventory level across network 110 to a computing device 111 designed to receive measurements from each of sensor 108. In some examples, sensor 108 can measure other parameters such as temperature, humidity, pressure, or GPS location and can send this data as well across network 110. In some embodiments, a sensor 108 may wirelessly transmit and receive electronic data to and from network 110 via a wireless transceiver embodied in sensor 108. In some embodiments, a sensor 108 may transmit and receive electronic data via a wired coupling to the network 110, or via a local digital memory medium (e.g., an SD memory card, or a USB memory stick), that may be physically connected and disconnected to the sensor 108, and moved to and from a network connection to the network 110.

According to an embodiment, computing device 111 collects information across network 110 from different sources and executes software to estimate inventory levels and/or times at which inventory will be depleted for one or more of unmonitored stores 104. Network 110 may represent the Internet or any other network infrastructure. Some examples of network 110 include cellular communication, satellite communication, WIFI communication, radiofrequency (RF) communication, and fiber-optic communication.

Computing device 111 can be any computer system, such as a workstation, desktop computer, server, laptop, handheld computer, tablet computer (e.g., the iPad® tablet computer), mobile computing or communication device (e.g., the iPhone® mobile communication device, the Android™ mobile communication device, and the like), VR device or VR component (e.g., headset, hand glove, camera, treadmill, etc.) or other form of computing or telecommunications device that is capable of communication and that has sufficient processor power and memory capacity to perform the operations described in this disclosure. A distributed computational system can be provided including a plurality of such computing devices. According to some embodiments, computing device 111 includes a processor 112, memory 114, network I/O 116, and an I/O device 118. Computing device 111 may also have a graphical user interface (GUI) 120 that may include a display and a user input device. In some embodiments, GUI 120 represents a command-line interface.

According to some embodiments, memory 114 represents any transitory or non-transitory internal memory or computer-readable media having encoded thereon one or more computer-executable instructions or software for implementing techniques as variously described in this disclosure. Memory 114 can include a computer system memory or random access memory, such as a durable disk storage (which can include any suitable optical or magnetic durable storage device, e.g., RAM, ROM, Flash, USB drive, or other semiconductor-based storage medium), a hard-drive, CD-ROM, or other computer readable media, for storing data and computer-readable instructions or software that implement various embodiments as taught in this disclosure. Memory 114 can be provided on the computing device 111 or provided separately or remotely from the computing device 111.

According to some embodiments, processor 112 of the computing device 111 is configured to execute commands to estimate inventory levels and/or times at which inventory will be depleted for one or more unmonitored stores within monitoring environment 100. Processor 112 may be used to execute computer-readable and computer-executable instructions or software stored in memory 114 as well as other programs for controlling system hardware. Network I/O 116 can be any appropriate network chip or chipset which allows for wired or wireless connection between computing device 111 and communication network 110 in order to send/receive data from other computing devices and resources.

A user can interact with computing device 111 through I/O device 118, such as a screen or monitor, which can display one or more user interfaces or images, including data regarding fill levels or resupply schedules for unmonitored stores, as provided in accordance with some embodiments. Computing device 111 can include I/O devices 118 for receiving input from a user, for example, a keyboard, a joystick, a game controller, a pointing device (e.g., a mouse, a user's finger interfacing directly with a touch-sensitive display device, etc.), or any suitable user interface, including an AR headset. The computing device 111 may include any other suitable conventional I/O peripherals. In some embodiments, computing device 111 includes or is operatively coupled to various suitable devices for performing one or more of the aspects as variously described in this disclosure.

According to some embodiments, computing device 111 receives measurement monitored data from sensors 108 of monitored stores 106. The measurement monitored data may include current inventory levels of monitored stores 106 and can be received at a fairly high frequency depending on the configurable nature of sensor 108. For example, sensor 108 may be designed to transmit measurement data multiple times a day or once a day. In some embodiments, sensor 108 takes multiple data measurements at a first frequency but transmits the data at a second frequency lower than the first frequency. The frequency of data transmission may depend on what material is being held within a given store and how often it is being used.

Computing device 111 also receives historical data from other sources regarding both monitored stores 106 and unmonitored stores 104, according to an embodiment. For example, computing device 111 receives historical manual stores data 122, which may include past times (e.g., dates and possibly times of day) that one or more of unmonitored stores 104 was resupplied and/or how much was resupplied. Historical manual stores data 122 may also include manual fill-level readings that had been taken of one or more of the unmonitored stores 104. Computing device may also receive historical monitored stores data 124, which may include past times (e.g., dates and possibly times of day) that one or more of the monitored stores 106 was resupplied and/or how much was resupplied. Historical monitored stores data 124 may also include any past sensor readings from one or more of the monitored stores 106.

According to some embodiments, computing device 111 also receives most recent updated data with regards to the monitored stores 106 and unmonitored stores 104 in order to continually update and refine models for estimating the inventory levels and/or times at which inventory will be depleted in the monitored stores 106. For example, computing device 111 may receive latest measurements from any of sensors 108 to provide the most recent inventory level measurements of any of monitored stores 106. Computing device 111 may also receive new manual stores data 126 corresponding to a latest manual measurement taken from one or more of unmonitored stores 104.

According to some embodiments, each of historical manual stores data 122, historical monitored stores data 124, and updated new manual stores data 126 is received from a second computing device, such as a computing device associated with the plurality of stores 102. The second computing device may be owned by a consumer that uses the materials stored in plurality of stores 106, and thus the consumer provides the additional data about their stores to computing device 111. In some embodiments, the additional data is provided to computing device 111 from different sources. For example, a consumer may provide some of the data (e.g., new manual stores data 126) via their smartphone or other computer, while a separate computer keeps track of the historical manual stores data 122 and historical monitored stores data 124 and sends this data automatically to computing device 111.

Figure 2:
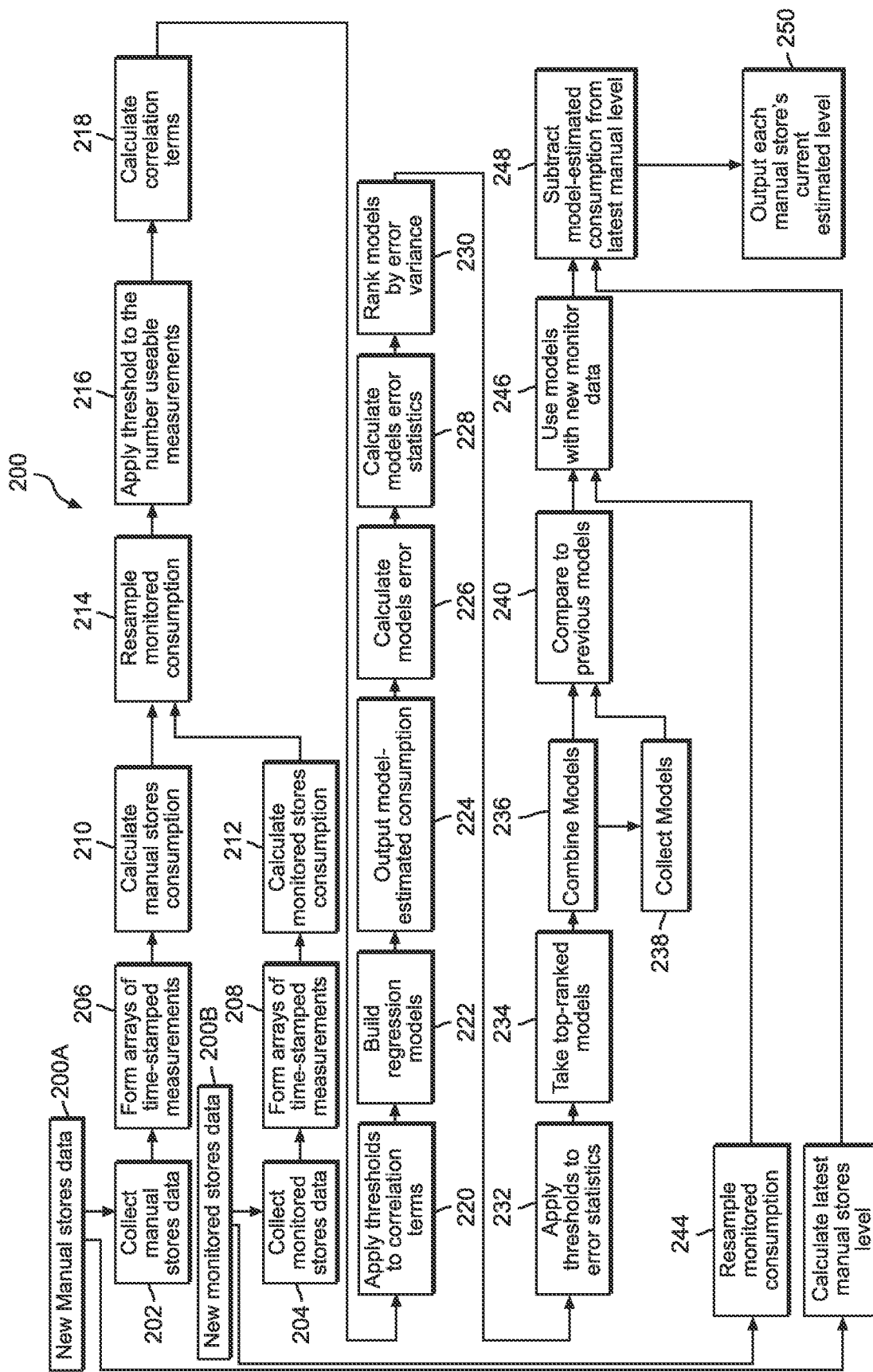
FIG. 2 depicts a block diagram of a flowchart of an exemplary store monitoring method, in accordance with one embodiment of the present invention.

Referring to FIG. 2, FIG. 2 depicts a block diagram of a flow chart of an exemplary method 200 for estimating an inventory parameter, such as the inventory level, of one or more manual stores, in accordance with an embodiment. Method 200 may be performed, for example, in whole or in part by computing device 111 as described with respect to FIG. 1. The operations, functions, or actions described in the respective blocks of example method 200 may also be stored as computer-executable instructions in a non-transitory computer-readable medium, such as a memory and/or a data storage of a computing system. As will be further appreciated in light of this disclosure, for this and other processes and methods disclosed herein, the functions performed in method 200 may be implemented in a differing order. Additionally, or alternatively, two or more operations may be performed at the same time or otherwise in an overlapping contemporaneous fashion.

Method 200 is presumed to begin with a clean slate of data, and therefore, from the perspective of method 200, method 200 uses new manual stores data 200A and new monitored stores data 200B, in which such data arise and/or are generated in the course of operation of the stores 104, 106. However, "new" in this context means "new to the method" and may encompass any available data, including historical data of past events, previously accurate data that are not presently applicable, currently valid data that were recently obtained or created, and even expected data of anticipated future events, such as when a user knows with reasonable certainty that an inventory will be refilled to a specific level (e.g., maximum capacity) on a given date (e.g., tomorrow). Method 200 includes the collection of both manual data at block 202 (from one or more unmonitored stores) and monitored data at block 204 (from one or more monitored stores), according to an embodiment. The manual data may include historical data collected from N manual stores, in which $0 < N < \infty$, where the historical data may include, for example, one or more of times (e.g., dates and possibly times of day) that the manual store was resupplied, the final liquid level amount of the store after being resupplied, and any liquid level measurements taken between resupplies. Similarly, the monitored data may include historical data collected from M monitored stores over the same time period, in which $0 < M < \infty$, where the historical data may include one or more of times (e.g., dates and possibly times of day) that the monitored store was resupplied, the final liquid level amount of the store after being resupplied, and any liquid level measurements taken between resupplies. New data may be added to the collections of manual and monitored stores data as it is sent from a client.

According to an embodiment, the collected historical datasets are converted into a series of time-stamped inventory level measurements for each store (both manual stores at block 206 and monitored stores at block 208). For the example application of an industrial chemical distributor using this system, the manually collected data could be taken when tanks are resupplied, and data collected from monitored tanks may be taken automatically by a remote sensor. Each measurement for each tank may also be marked as to which tank it corresponds.

According to an embodiment, U measurements may be collected for each manual store. Then, for each manual store, method 200 proceeds to block 210 where the amount of materials consumed between each measurement is calculated by taking the difference between the inventory levels (e.g., gallons of chemicals) and saving this difference as a consumption series. For a total of N manual stores, the consumption series each have a length of (U−1), in which $0 < U < \infty$. The amount of time between each manual store's measurement may be calculated and saved as a (U−1) series of time periods with the consumption series, according to an embodiment. Similarly, S measurements may be collected for each monitored store, in which $0 < S < \infty$. Then, for each monitored store, method 200 proceeds to block 212 where the amount of materials consumed between each sensor measurement is calculated by first removing changes in inventory level that occur when the materials are replenished and then by taking the difference between the inventory levels (e.g., gallons of chemicals), according to an embodiment. Each of these may be saved for a total of M consumption series with length (S−1).

According to an embodiment, method 200 continues to block 214 where, for each manual store, the monitored store's consumption series data is resampled by calculating the cumulative sum of monitored material consumed between each manual store's level measurement, resulting in M re-sampled monitored stores consumption series now each with length (U−1). In the event a monitored store did not provide data during the time period between any two manual store measurements, the value for re-sampled consumption series for that time period may be set to a null value. These M series are combined with their corresponding manual store's consumption series to generate N matrices of size (U−1) by (M+1), according to an embodiment.

According to an embodiment, method 200 continues to block 216 where a threshold $T_1$ is applied to the number of non-null values in each manual store's matrix of consumption series. The threshold may be applied to minimize the probability of spurious correlations in later operations. For each manual store's consumption matrix, any monitored store's re-sampled consumption series with fewer than $T_1$ non-null values may be removed from the matrix.

According to an embodiment, method 200 continues to block 218 where, for each manual store's consumption matrix with $M_1$ remaining re-sampled monitored consumption series, the manual store's consumption series are paired with each of the $M_1$ monitored consumption series and both $M_1$ correlation coefficients and null-hypothesis probabilities are determined.

According to an embodiment, at block 220 thresholds $T_2$ and $T_3$ are applied to the correlation coefficients and null-hypothesis probabilities. This may be performed to minimize the computational complexity of subsequent operations. For each manual store's consumption matrix, any correlation coefficient below $T_2$ or null-hypothesis probability above $T_3$ causes the monitor consumption series used to generate them to be removed from the matrix.

Method 200 proceeds to block 222 where a regression analysis is used to model the manual store's consumption series as a continuous function of the monitored store's re-sampled consumption series for each manual store's consumption matrix and for each $M_2$ remaining re-sampled monitored consumption series, according to an embodiment. This generates $M_2$ equations, which may be referred to as models, each with one independent variable and one dependent variable with the general form $y = f(x)$ where y is the estimated amount of material consumed by the manual store and x is the amount consumed by the monitored store during the same time period.

According to an embodiment, method 200 proceeds to block 224 where, for each manual store's consumption matrix and for each $M_2$ model, the re-sampled monitor consumption series is used as input to their respective model and each model's estimate of the manual store's consumption series is calculated. Here each re-sampled monitor consumption series is already of length (U−1), and so each model's output is the same length as the manual store's consumption series.

According to an embodiment, method 200 proceeds to block 226 where, for each manual store's consumption matrix, for each $M_2$ model, and for each (U−1) consumption estimates (U−1) error values are calculated as follows:

$$\frac{(\text{Model Estimated Consumption} - \text{Actual Manual Store Consumption})}{\text{Number of Days in Time Period}}$$

According to an embodiment, for each manual store's consumption matrix and for each $M_2$ model, the average of the error values and the variance the error values are calculated at block 228.

According to an embodiment, method 200 continues to block 230 where, for each manual store's consumption matrix and for each $M_2$ model, the models are ranked in order of decreasing error variance.

According to an embodiment, for each manual store's consumption matrix, a threshold $M_3$ is used at block 232 and all but the top $M_3$ models are removed at block 234. The remaining models correspond to those which have the smallest error variance. If there are fewer than $M_3$ models following the operations performed in blocks 230, 232, and 234, then all remaining models are taken.

According to an embodiment, method 200 proceeds to block 236 and block 238, in which each manual store's set of models respectively are combined and collected and saved along with unique identifiers of the monitored stores from which they were derived for comparison with future models that may be built with additional manual stores data.

According to an embodiment, for each manual store, if there are models from previous iterations collected at block 238 that were derived from the associated monitored store then the terms of the new model are compared to the terms of the previous model at block 240. For example, if the previous model took the form of $y=A_1x^3+B_1x^2+C_1x$ and the new model tool the form $y=A_2x^3+B_2x^2+C_2x$, then the comparison of terms would include $A_1$ to $A_2$, $B_1$ to $B_2$, and $C_1$ to $C_2$. If any of these term pairs are different by more than a threshold $M_4$, then an alert may be generated so that a user may take a closer look at the data used to generate the model before accepting its level estimate.

According to an embodiment, at block 242 the latest manual store measurement is used to initialize a digital copy of each manual store's inventory.

According to an embodiment, as new monitor data is received over time, consumption may be resampled, as illustrated by block 244, and the manual store's consumption is estimated using new data from the monitored stores in each manual store's set of models at block 246. According to some embodiments, this process may be repeated as often as, but no faster than, monitor data is received to generate level estimates at the similar fidelity as the monitor data. This process may also be repeated at an intermediate frequency (e.g., daily) to cover any reporting time period. For each manual store, for each model, and for each reporting time period, the method includes identifying which monitored tanks in the combined model have data available for use within that time period. For each K monitored tank that has data available with standard deviation of error a, the system calculates weight terms ω as follows:

$$\omega_i = \frac{\frac{1}{\sigma_i^2}}{\sum_{i=1}^{K} \frac{1}{\sigma_i^2}}$$

The output of the i'th model is weighted by multiplying its output by its respective weight term $\omega_i$. The sum of the weighted outputs for each reporting time period are taken together to estimate the manual store's consumption during the reporting time period, according to an embodiment. The estimated consumption may then be subtracted from the digital copy of the manual store to calculate the current level estimate for the manual store at block 248. In some embodiments, this value also updates the digital copy of the manual store. At block 250, the level estimates for the manual store may be saved for future use, output for viewing by a user or used along with the manual historical data to determine a future time at which the inventory will be depleted for the manual store.

Figure 3:
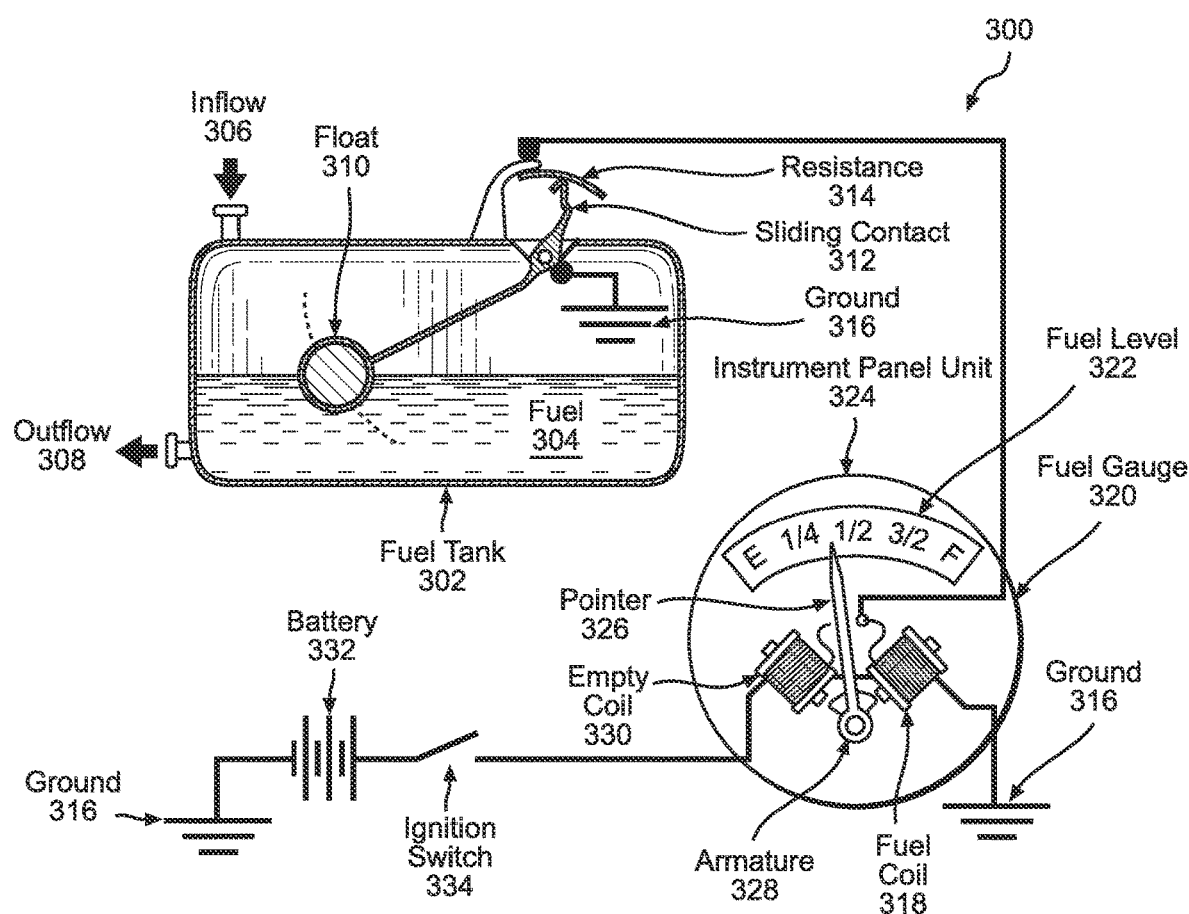
FIG. 3 depicts a simplified assembly structure illustrating aspects of an exemplary store, storing fluid fuel as inventory, with which the present may be used, in accordance with one embodiment of the present invention.

Referring to FIG. 3, FIG. 3 depicts a simplified assembly structure illustrating aspects of an exemplary store 102, storing fluid fuel as inventory, with which the present may be used, in accordance with one embodiment of the present invention. In particular, FIG. 3 depicts a simplified pictorial diagram of an exemplary assembly 300 of aspects of a store 102. The assembly 300 is depicted as including a fuel tank 302 containing a fluid fuel 304, in which fuel 304 enters tank 302 via an inflow 306 and exits tank 302 via an outflow 308. As depicted, the fuel 304 supports a float 310 floating at the surface of fuel 304. The float 310 is depicted as connected to a sliding contact 312 that slides with respect to a resistance element 314. The sliding contact 312 is electrically grounded via a ground element 316, one of several in the assembly 300. The resistance element 314 is electrically coupled to a fuel coil 318 of an analog fuel gauge 320 adapted to represent an indication of a fuel level 322 in the fuel tank 302 and display the indication of the fuel level 322 on an instrument panel unit 324 using a pointer 326. The fuel coil 318 is electrically coupled to a ground element 316. The pointer 326 pivots using an armature 328 between the fuel coil 318 and an empty coil 330 to adjust the indication of the fuel level 322 relative to the instrument panel unit 324 in response to opposing electromagnetic forces imparted by the fuel coil 318 and the empty coil 330. The empty coil 330 may have a charge from capacitance or, as depicted in FIG. 3, be powered by being electrically coupled to a battery 332, the electrical coupling and power of which may be coupled, as depicted in FIG. 3, via an ignition switch 334. The ignition switch 334 may be adapted to activate and deactivate the fuel gauge 320 when the ignition switch 334 respectively is engaged (i.e., the switch 320 is closed or in a closed position) and disengaged (i.e., the switch 320 is open, opened, or in an open or opened position).

The assembly 300, and in particular, fuel gauge 320, may be electrically coupled to an electronic sensor 108 to create an electronically monitored store 106. In contrast, an assembly 300 without an electronic sensor 108 having a connection to network 110 would create an electronically unmonitored store 104. The electronic sensor 108 may be adapted to sense the status of fuel level 322 that to be represented on the fuel gauge 320. In some embodiments, an electronic sensor 108 may perform or replace the functions of multiple parts, such as sliding contact 312, resistance element 314, fuel coil 318, fuel gauge 320, instrument panel unit 324, pointer 326, armature 328, and empty coil 330. An exemplary electronic sensor 108 suitable for use with an embodiment of the present invention is depicted in and described with respect to FIG. 2 et seq. of U.S. Pat. No. 10,552,721 B2, mentioned above. A preferred embodiment of an electronic sensor 108 may include a wireless transmitter or transceiver, such as may operate using technology associated with Near-Field Communication ("NFC"), Radio Frequency Identification ("RFID"), low energy pairing ("Bluetooth"), wireless routers ("Wi-Fi"), and/or cellular or mobile phone networks (e.g., "2G," "3G," "4G," "LTE," or "5G"). Depending on the capabilities of the wireless functionality of a preferred sensor 108, a preferred sensor 108 may communicate the data directly to the network 110 with or without an intermediate communication device. In some embodiments, the electronic sensor 108 may directly sense the fuel level 322, locally display the fuel level 322, and communicate the fuel level 322 via digital monitored data to a computing device 111. Such monitored data may include, for instance, the fuel level 322, possibly including units of measurement, time of measurement, preferably including both date and time of day, and other inventory parameters, such as temperature of the store and/or inventory, total capacity of the store 102 or fuel tank 302, inventory usage since last refill, time of last refill, amount of last refill, remaining fuel 304 in the fuel tank 302, and empty capacity of the fuel tank 302, among other inventory parameters, which may include store parameters.

Figure 4:
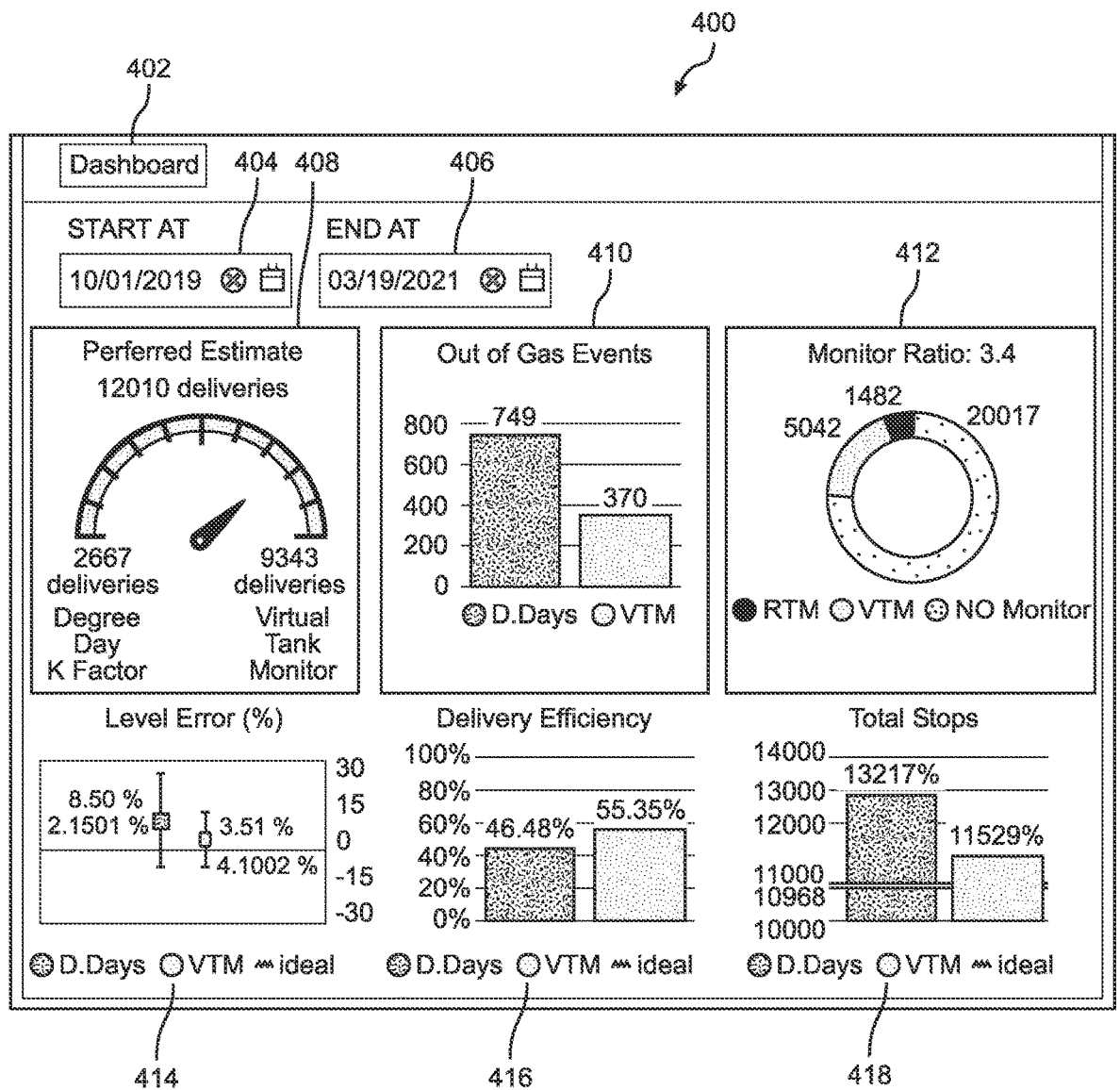
FIG. 4 depicts a screenshot view of aspects of an exemplary graphical user interface illustrating an exemplary software application dashboard of an exemplary computer program product, in accordance with one embodiment of the present invention.

Referring to FIG. 4, FIG. 4 depicts a screenshot view of aspects of an exemplary graphical user interface 400 illustrating an exemplary software application dashboard 402 of an exemplary computer program product, in accordance with one embodiment of the present invention. Graphical user interface 400 may be an embodiment of GUI 120 of FIG. 1, and GUI 120 itself may be a block diagram representation for the computer program product generating GUI 120 and performing computer-implemented methods 200 in FIG. 2. As depicted in FIG. 4, GUI 400 includes a dashboard 402 having customizable data representations and summaries that may be specified, for instance, by a start at date field 404 and an end at date field 406. The data summaries may include, for example, a preferred estimate gauge 408, an out of gas events bar graph 410, a monitor ratio annular graph 412, a percentage error level distribution graph 414, a percentage delivery efficiency bar graph 416, and a total stops bar graph 418.

In preferred embodiments of dashboard 402, each of these data representations 408, 410, 412, 414, 416, and 418 preferably may be configured by a user of the GUI 400 to customize the representation and visualization of the user's data to facilitate the user's understanding of the data. These data representations may summarize and analyze unmonitored data 122, 126, 200A and monitored data 124, 200B to assist a user in optimizing a user's use of a method 200 in a monitoring environment 100. As depicted in FIG. 4, unmonitored data 122, 126, 200A are identified as relating to a Virtual Tank Monitor ("VTM") or a "No Monitor" unmonitored store 104, whereas monitored data 124, 200B are identified as relating to a Real Tank Monitor ("RTM") monitored store 106.

As depicted FIG. 4, other data presented in dashboard 402 may include, for instance, the total number of deliveries, the number of deliveries where a degree days k-factor method performs better than VTM estimated delivery, the numbers of out of gas events incurred by a degree days k-factor delivery method versus a VTM delivery method, percentages of lever errors incurred by a degree days k-factor estimation method versus the VTM estimation method, delivery efficiency on stores using a degree days k-factor method versus the VTM method, number of total delivery stops incurred by a degree days k-factor delivery method versus a VTM delivery method, ratios of stores (e.g., unmonitored stores to monitored stores), and ideal values for the corresponding data types, where applicable. In preferred embodiments, ideal values may be computed and determined in view of the activities of the monitoring environment 100 and the operations of the unmonitored stores 104 and monitored stores 106 in performing method 200 using a computer program product of GUI 120, 400. Aggregating the data from multiple stores 102 creates larger sample sizes for purposes of statistical analyses, which allows a user and the computer program product to better analyze the data and hopefully to better optimize the activities of the monitoring environment 100.

Figure 5:
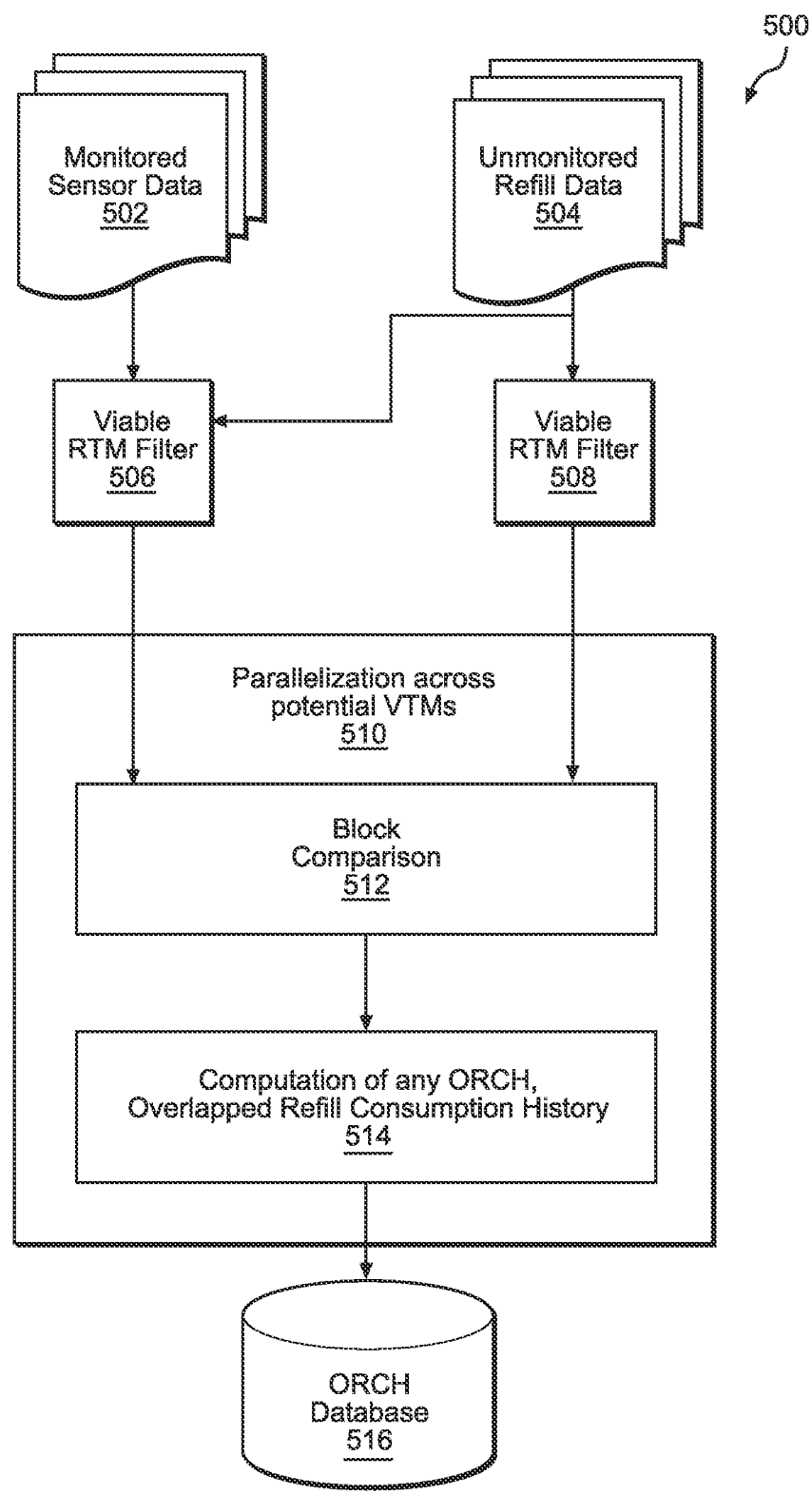
FIG. 5 depicts a block diagram of a flowchart of another exemplary store monitoring method, in accordance with one embodiment of the present invention.

Referring to FIG. 5, FIG. 5 depicts a block diagram of a flow chart of another exemplary method 500 for estimating an inventory parameter of one or more manual stores, in accordance with an embodiment. In particular, method 500 may be performed to determine an Overlapped Refill Consumption History ("ORCH") for a given store 102 or plurality of stores 102. An Overlapped Refill Consumption History refers to the record of refill events and intervening periods of consumption for stores 102. In practice, apart from the possibility of having each store 102 receive its refill on exactly the same day for every refill, each store 102 typically is refilled or resupplied on a different day from each other store 102. Nonetheless, some stores 102 occasionally will be refilled on the same day, meaning that their refills overlapped. As such, the similarities and differences in refill events and intervening consumption activities give rise to the concept of overlap, referring, for example, to the overlapping refills. The knowledge of when, where, and how often overlaps occur can be leveraged to improve the estimations of method 200, as well as reduce the computational effort thereof. Method 500 is adapted to identify each significant ORCH and collect these ORCH instances for use in optimizing the calculations of method 200.

Method 500 may be performed, for example, in whole or in part by computing device 111 as described with respect to FIG. 1. in a monitoring environment 100, which similarly may be considered to comprise a computing environment for performance of method 500. Likewise, method 500 may be performed in conjunction with, before, or after steps of method 200 in FIG. 2. The operations, functions, or actions described in the respective blocks of example method 500 may also be stored as computer-executable instructions in a non-transitory computer-readable medium, such as a memory and/or a data storage of a computing system. As will be further appreciated in light of this disclosure, for this and other processes and methods disclosed herein, the functions performed in method 500 may be implemented in a differing order. Additionally, or alternatively, two or more operations may be performed at the same time or otherwise in an overlapping contemporaneous fashion.

Method 500 may be presumed to begin with an existing supply of unmonitored data 122, 126, 200A and monitored data 124, 200B, which may be used to form a basis of statistical analysis of new data upon arrival to a computing device 111. However, from the perspective of method 500, method 500 uses new monitored sensor data in block 502 and new unmonitored refill data in block 504, in which such data arise and/or are generated in the course of operation of the stores 104, 106. As in method 200, "new" in this context means "new to the method" and may encompass any available data, including historical data of past events, previously accurate data that are not presently applicable, currently valid data that were recently obtained or created, and even expected data of anticipated future events, such as when a user knows with reasonable certainty that an inventory will be refilled to a specific level (e.g., maximum capacity) on a given date (e.g., tomorrow).

Method 500 includes the collection of both monitored sensor data at block 502 (from one or more monitored stores with networked sensors 108) and unmonitored refill data at block 504 (from one or more unmonitored stores whose data are collected, for example, when the stores are refilled), according to an embodiment. The manual data may include historical data collected from N manual stores, in which $0 < N < \infty$, where the historical data may include, for example, one or more of times (e.g., dates and possibly times of day) that the manual store was refilled or resupplied, the final liquid level amount of the store after being refilled or resupplied, and any liquid level measurements taken between refills or resupplies. Similarly, the monitored data may include historical data collected from M monitored stores over the same time period, in which 0<M<∞, where the historical data may include one or more of times (e.g., dates and possibly times of day) that the monitored store was refilled or resupplied, the final liquid level amount of the store after being refilled or resupplied, and any liquid level measurements taken between refills and resupplies. New data may be added to the collections of manual unmonitored stores data and monitored stores data as the data are sent from a client.

The monitored sensor data 502 and the unmonitored refill data 504 may be analyzed by applying a Viable RTM Filter in block 506 and a Viable VTM Filter in block 508. As mentioned above with respect to FIG. 4, RTM refers to a Real Tank Monitor, whereas VTM refers to a Virtual Tank Monitor. Each filter 506, 508 applies a statistical analysis (possibly based in part on existing data) to its respective new data 502, 504 to determine whether the new data 502, 504 would be beneficial in adjusting the applicable model to better estimate the corresponding inventory parameter. The Viable RTM Filter 506 may be applied to both the monitored sensor data 502 and the unmonitored refill data 504, because both datasets represent actual measurements, even though obtained by different means. In contrast, to reduce computational effort of the method, the Viable VTM Filter 508 need be applied only to the unmonitored refill data 504, because the filtering criteria of the VTM Filter 508 would be unproductive and inapplicable to the monitored sensor data 502, all of which, if the data pass the filter 506, presumably would pass the Viable VTM Filter 508 and be deemed "viable" data for use in adjusting the model.

The Viable RTM Filter 506 may involve filtering the monitored data by a monitored data filter to remove any non-compliant monitored data that do not meet a monitored data filter requirement of the monitored data; and then providing to a computing environment any compliant monitored data, in which compliant monitored data comprise monitored data that pass the monitored data filter, after meeting each monitored data filter requirement, and after removing non-compliant monitored data. Similarly, the Viable VTM Filter 508 may involve filtering the unmonitored data by an unmonitored data filter to remove any non-compliant unmonitored data that do not meet an unmonitored data filter requirement of the unmonitored data; and providing to the computing environment any compliant unmonitored data, in which compliant unmonitored data comprise unmonitored data that pass the unmonitored data filter, after meeting each unmonitored data filter requirement, and after removing non-compliant unmonitored data. After using the filters 506, 508, the method 500 may involve collecting the compliant monitored data and the compliant unmonitored data in the computing environment for purposes of comparing any non-blocked compliant monitored data and any non-blocked compliant unmonitored data.

In a monitoring environment 100 comprising fuel tanks 302 having fluid fuel 304, exemplary VTM and RTM filtering rules may include, for example, applying the following requirements to pass the respective filter 506, 508. For example, an exemplary Viable RTM Filter 506 may filter out non-compliant monitored sensor data 502 and unmonitored refill data 504 by requiring that data 502, 504 include a minimum of at least three (3) refills per tank, that the tanks were not churned (i.e., refilled within last 365 days), and that any monitored sensor data 502 show less than fifteen percent (<15%) median disagreement between monitor readings and refill readings (i.e., at least 85% median of agreement between the monitored data and the refill data). Similarly, for example, an exemplary Viable VTM Filter 508 may filter out non-compliant unmonitored refill data 504 by requiring that unmonitored refill data 502 include a minimum of at least three (3) refills per tank, and that the tanks were not churned (i.e., refilled within last 365 days). In such an exemplary monitoring environment 100 comprising fuel tanks 302 having fluid fuel 304, there may be 55,030 unmonitored tanks and 1,533 monitored tanks. Of the 55,030 unmonitored tanks, 17,618 tanks may be filtered out due to having fewer than three refills (i.e., insufficient numbers of refills), and 31,045 tanks may be filtered out due to having been churned (i.e., refilled within the last 365 days), combining to filter out 33,646 unmonitored tanks, in which some tanks met both filtering criteria. Filtering out 33,646 of the 55,030 tanks leaves 21,384 "Viable VTM" unmonitored tanks, for a "Viable VTM" percentage of 38.9 percent (38.9%). Of the 1,533 monitored tanks, 24 tanks may be filtered out due to having fewer than three refills (i.e., insufficient numbers of refills), 266 tanks may be filtered out due to having been churned (i.e., refilled within the last 365 days), and 124 tanks may be filtered out due to refill-monitor disagreement (i.e., data discrepancies), combining to filter out 346 monitored tanks, in which some tanks met multiple filtering criteria. Filtering out 346 of the 1,533 tanks leaves 1,187 "Viable RTM" monitored tanks, for a "Viable RTM" percentage of 77.4 percent (77.4%).

Once the filters 506, 508 screen the data 502, 504, the portions of data 502, 504 that pass the respective filters 506, 508 may be parallelized for computational purposes in a step of parallelization across potential VTMs in block 510. Parallelizing and parallelization refer to the concept of parallel processing or distributed computing, which is a performance strategy applied with the intention to have the requisite computing take less time. As such, some embodiments of the computing environment of method 500 may comprise a parallelization comprising parallel processing or distributed computing. In a distributed network of parallelized computers, a computer can be a parallel distributed computer rather than a typical, stand-alone computer, which is limited by its individual computational power. abilities and resources. Parallelization may be implemented, for instance, using a network of computers, each of which is operating as a virtual machine ("VM") remotely controlled by the main computer, but able to independently compute calculations assigned to the VM. However, although preferred, parallelization may be optional, such as for smaller datasets.

Within a monitoring environment 100, whether or not parallelized computation is used in the computing environment, the filtered data of data 502, 504 may be subjected to a block comparison in block 512, and the results of the block comparison 512 may be provided to block 514 for computation of any ORCH, Overlapped Refill Consumption History, as an example of an overlapped event history. Any ORCH that is identified in the computations of block 514 is then provided to and stored in an ORCH Database in block 516. The ORCH database 516 is available for use in method 200 in adjusting and optimizing the respective models.

Block 512 may employ a blocking module that is adapted to confirm that the monitored store and the unmonitored store share similarities in store configuration, store inventory, and inventory events. These similarities enable the unmonitored store to be better compared with the monitored store for purposes of estimating the inventory parameter of the unmonitored store, in which a measured inventory parameter of the monitored store may be extrapolated or interpolated to generate an estimated inventory parameter of the unmonitored store.

Method 500 preferably is adapted in block 512 to inexpensively, efficiently, and effectively block comparison of ORCH computations, which can be time-consuming and expensive to compute, that are known or reasonably expected to be of little or no use for a given model. Block 512 may be adapted to block comparison of data if, for instance, the data are not from the same type of customer or product (e.g., propane versus natural gas), are not from the same or reasonably similar type of store (e.g., stores that differ in tank capacities by more than 25%), are not from the same or reasonably similar geographical area, type, or location (e.g., stores that differ in geographical type (mountains versus plains) or are more than 100 miles apart), and/or lack a minimum number of overlapped or overlapping refills (e.g., stores that share fewer than seven (7) overlapped refills). If some embodiments, a comparison may be blocked if the data meet only one of such blocking criteria, whereas in other embodiments, data may be blocked only if they meet more than one or all the blocking criteria. The stricter the blocking logic, the easier blocking becomes, and the more comparisons are blocked, reducing the number of comparison computations. For example, in testing, strict blocking logic requiring that data meet only one of the blocking criteria resulted in blocking of about 91% of possible comparisons, reducing the ORCH calculation time to one hundredth ($1/100^{th}$) (i.e., 1%) of the original computation time needed to for ORCH calculations without any blocking of comparisons.

Viewing block 512 at a higher level, block 512 may use a blocking module in the computing environment and may involve blocking comparison of a corresponding dataset of compliant monitored data and compliant unmonitored data. In particular, the blocking module may be adapted to block comparison of any blocked corresponding dataset of any blocked compliant unmonitored data and any blocked compliant unmonitored data that does not meet a blocking module requirement of the corresponding dataset of the compliant monitored data and the compliant unmonitored data. Likewise, the blocking module may be adapted to not block comparison of any non-blocked corresponding dataset of any non-blocked compliant unmonitored data and any non-blocked compliant unmonitored data that does meet each blocking module requirement of the corresponding dataset of the compliant monitored data and the compliant unmonitored data.

Block 512 may pass any non-blocked corresponding datasets to a computation module of block 514 in the computing environment. The computation module may involve computing an overlapped event history as a factor of the correlation between the stores 102 of the non-blocked corresponding dataset, in which the overlapped event history is computed by comparing the non-blocked corresponding dataset of the non-blocked compliant monitoring data and the non-blocked compliant unmonitored data. Block 514 may pass the overlapped event history data to the ORCH database of block 516. In general, block 516 may involve storing each overlapped event history as overlapped event history data in an overlapped event history database in the computing environment, in which the overlapped event history data and the overlapped event history database are available for use in subsequent steps of the method, including any repeated steps of the method.

Method 500 preferably is adapted in block 514 to inexpensively, efficiently, and effectively improve ORCH computations, in addition to the overall reduction of the number of ORCH computations performed due to the blocking of comparisons in block 512. Exemplary adaptations to improve ORCH computations include using a Python line profiler to find simple optimizations in computing code, stopping repeated slicing pandas DataFrame, using DataFrame indices wherever feasible or practicable, and reusing extracted IDs (i.e., extracting an ID once, and reusing it many times, whenever possible). Other possible tweaks include refactoring the kernel smoother, using pre-computed ORCHs when possible, using in-memory ORCH data, using more VM worker computers to achieve a broader computing distribution, refactoring datasets in different levels to simplify datasets, adding new blocking rules, making blocking stricter, using either batch calculation of ORCHs or incremental calculation of ORCHs depending on other optimization factors (i.e., test both batch and incremental for a given configuration to see which is faster), and/or dividing up datasets to smaller subsets where sensible. Such adaptations in block 514 may result in optimizations that yield computational speed improvements of up to about five times the computational speed, as achieved in testing. In conjunction with the parallelization of computing in block 510 and the comparison blocking of block 512, optimization of ORCH computations in block 514 can yield significant reductions in total computation times. For example, in testing, non-optimized calculations originally ran for about 48 hours, whereas optimized calculations of the same original data were completed in less than 23 minutes.

In a monitoring environment 100 of a liquid fuel 304 in fuel tanks 302, a typical ORCH database 516 may include a variety of data points, for a VTM and/or or an RTM, such as previous fill dates, days since previous refills, average daily consumption percentages, average daily consumption quantities in gallons, and total days in the period between refills. An appropriately designed key-value data store may be used as a preferable ORCH database, as well as a preferable back testing feature store. As the numbers of VTM stores 104 (VTM count) and RTM stores 106 (RTM count) increase, the ORCH calculation count significantly increases as a multiplication of the VTM count times the RTM count. For example, a VTM count of 200 and an RTM count of 100 yield an ORCH calculation count of 20,000. As a result, using method 500 to reduce computation efforts can yield significant time reductions and efficiencies in calculating models and inventory parameters. For instance, calculating a model and/or inventory parameter daily from scratch may take much time, may be very inefficient, and may proceed very slowly. In comparison, calculating the same model or parameter once per week instead of daily, and indexing the intervening days, may be slow, and also inefficient, but not as slow or inefficient as daily calculations. In contrast, calculating the same model or parameter once mid-week, with intelligently skipping or blocking ORCH computations that do not need to be done, may be much more efficient and significantly faster than daily computations from scratch, especially as the ORCH calculation count increases.

Leveraging the ORCH database 516, the computer-implemented method may generate a model to estimate the correlation between the corresponding inventory level and the corresponding time of the unmonitored store based at least on the overlapped event history data and on the non-blocked corresponding datasets of the non-blocked compliant monitored data and the non-blocked compliant unmonitored data; estimate the correlation between the corresponding inventory level and the corresponding time for the unmonitored store based on the model; and estimate an inventory parameter of the unmonitored store based on the model. Estimating an inventory parameter of the unmonitored store may include using the correlation between the corresponding inventory level and the corresponding time of the unmonitored store to estimate a corresponding inventory level estimate of the unmonitored store for a specified time, to estimate a corresponding time estimate for a specified inventory level of the unmonitored store, or to estimate the corresponding inventory level estimate for the specified time and to estimate the corresponding time estimate for the specified inventory level.

Figure 6:
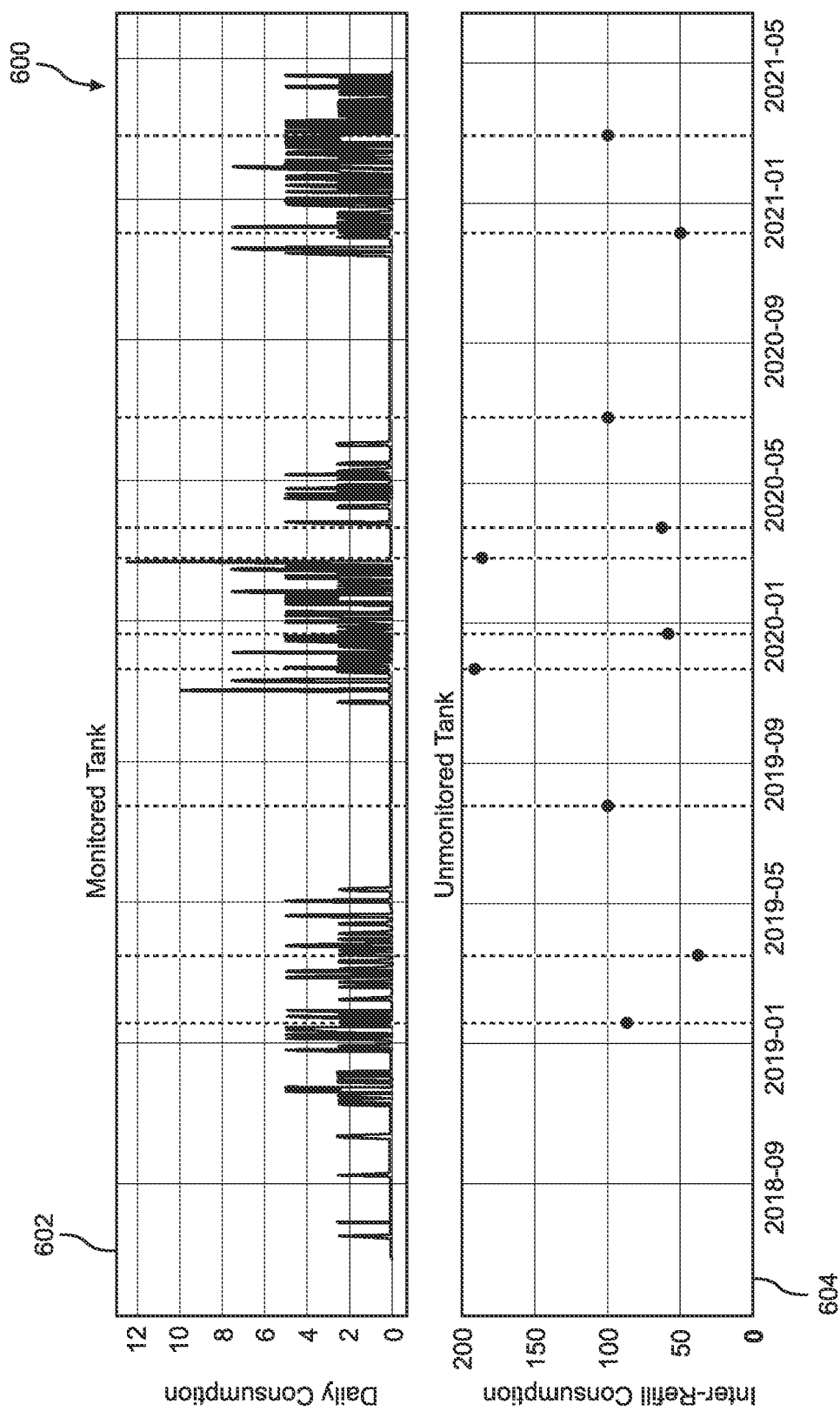
FIG. 6 depicts a pair of exemplary graphs of time-versus-quantity of fluid fuel consumption and refills for a monitored tank and an unmonitored tank to illustrate an exemplary overlapped refill consumption history, in accordance with one embodiment of the present invention.

Referring to FIG. 6, FIG. 6 depicts a pair of exemplary graphs of time-versus-quantity of fluid fuel 304 consumption and refills for a monitored tank 106 and an unmonitored tank 104 to illustrate an exemplary overlapped refill consumption history 600, in accordance with one embodiment of the present invention. Daily Consumption graph 602 charts the daily consumption of fluid fuel 304 (from 0 to 12 gallons) of a monitored tank 106. Inter-Refill Consumption graph 604 charts the limited data points of fluid fuel levels 322 (from 0 to 200 gallons) of an unmonitored tank 104.

The concept of overlap is visible on a comparison of time-vs-quantity graphs 602, 604 of historical refills (and intervening consumption tracked explicitly or implicitly) for unmonitored stores 104 and monitored stores 106, where overlaps of the refills of stores 102 are readily identified. Because activities (including refills) at monitored stores 106 are used in the present invention to estimate activities at unmonitored stores 104, the frequency of overlaps, or lack thereof, can impact potential variance, inaccuracy, imprecision, and/or uncertainty in the estimations, so methods 200, 500 may control for and/or leverage such overlaps to reduce such detrimental effects.

To the extent that the activities, such as refills, of an unmonitored store 104 are found to overlap frequently or closely with the activities of a monitored store 106, that monitored store 106 may present as a good candidate on which to base, or weight, a model of estimating future activities, like refills, for that unmonitored store 104. Moreover, if there is a history of overlapped refills between an unmonitored store 104 and a monitored store 106, rather than re-calculate the estimated status of the unmonitored store 104 every day, method 500 may determine the status calculation through application of an index, or similar correlation. Application of the index may reduce the computational aspects and effort and make the calculation finish faster, compared to the computational effort needed for re-calculating the correlation every day.

Numerous specific details have been set forth herein to provide a thorough understanding of the embodiments. It will be understood in light of this disclosure, however, that the embodiments may be practiced without these specific details. In other instances, well-known operations and components have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A system for estimating an inventory parameter of an unmonitored store based on a correlation between a corresponding time and a corresponding inventory level of the unmonitored store as of the corresponding time, the system comprising:
    a monitoring sensor adapted for use at a monitored store, wherein the monitoring sensor is an electronic sensor adapted to generate monitored data in a digital format, wherein the monitored data indicate an inventory level measurement at a measurement time for the monitored store; and wherein the electronic sensor is adapted to communicate via a communication device that is adapted to transmit the monitored data from the electronic sensor to a computing device;
    and a computer program product, wherein the computer program product is adapted to be stored on a non-transitory machine-readable medium of the computing device and includes computer instructions that are executable using a processor of the computing device that, when executed by the processor, cause the processor to execute a computer-implemented method for estimating the correlation between the corresponding time and the corresponding inventory level of the unmonitored store as of the corresponding time;
    wherein the computer-implemented method includes capabilities of:
        receiving monitored data generated using the monitoring sensor providing the inventory level measurement at the measurement time for the monitored store;
        receiving unmonitored data associated with the unmonitored store, wherein the unmonitored data indicate a historical corresponding inventory level as of a historical corresponding time for the unmonitored store;
        generating a model to estimate the correlation between the corresponding inventory level and the corresponding time of the unmonitored store based at least on the monitored data and the unmonitored data;
        estimating the correlation between the corresponding inventory level and the corresponding time for the unmonitored store based on the model; and
        estimating the inventory parameter of the unmonitored store based on the model;
    wherein estimating the inventory parameter of the unmonitored store includes using the correlation between the corresponding inventory level and the corresponding time of the unmonitored store to estimate a corresponding inventory level estimate of the unmonitored store for a specified time, to estimate a corresponding time estimate for a specified inventory level of the unmonitored store, or to estimate the corresponding inventory level estimate for the specified time and to estimate the corresponding time estimate for the specified inventory level;
    wherein the monitored store and the unmonitored store share similarities in store configuration, store inventory, and inventory depletion, whereby these similarities enable the unmonitored store to be compared with the monitored store for purposes of estimating the inventory parameter of the unmonitored store, in which a measured inventory parameter of the monitored store may be extrapolated or interpolated to generate an estimated inventory parameter of the unmonitored store;

wherein the monitored store comprises a store that includes the monitoring sensor;

wherein the unmonitored store comprises a store that does not include an electronic sensor adapted to generate the unmonitored data and transmit the unmonitored data to the computing device; and wherein the unmonitored data are not generated by an electronic sensor in communication with the computing device and transmitted to the computing device.

2. The system according to claim 1, wherein:
the unmonitored data comprise a historical resupply time for the unmonitored store and a historical inventory level measurement for the unmonitored store as of the historical resupply time.

3. The system according to claim 1, wherein:
the computer-implemented method further comprises:
receiving the monitored data measured by the monitoring sensor at a first frequency; and
receiving the unmonitored data obtained at a second frequency, in which the second frequency is lower than the first frequency.

4. The system according to claim 1, wherein:
the model comprises a first model and a second model; and
the generating comprises:
generating the first model for a first seasonal time period, and
generating the second model for a second seasonal time period, in which the second seasonal time period is different from the first seasonal time period.

5. The system according to claim 1, wherein:
the computer-implemented method further comprises:
receiving updated unmonitored data associated with the unmonitored store; and
updating the model based on the updated unmonitored data, wherein the model is updated to more accurately estimate the correlation between the corresponding inventory level and the corresponding time for the unmonitored store based on the model updated based on the updated unmonitored data.

6. The system according to claim 5, wherein:
the computer-implemented method further comprises:
estimating an inventory consumption rate for the unmonitored store.

7. The system according to claim 1, wherein:
the computer-implemented method further comprises:
receiving updated monitored data generated using the monitoring sensor associated with the monitored store; and
updating the model based on the updated monitored data, wherein the model is updated to more accurately estimate the correlation between the corresponding inventory level and the corresponding time for the unmonitored store based on the model updated based on the updated monitored data.

8. The system according to claim 7, wherein:
the updated monitored data comprise a most recent inventory level measurement for the monitored store.

9. The system according to claim 1, wherein:
the computer-implemented method further comprises:
estimating the corresponding inventory level estimate of the unmonitored store for the specified time.

10. The system according to claim 1, wherein:
the computer-implemented method further comprises:
estimating the corresponding time estimate for the specified inventory level of the unmonitored store.

11. A method for estimating an inventory parameter of an unmonitored store based on a correlation between a corresponding time and a corresponding inventory level of the unmonitored store as of the corresponding time, the method comprising:
communicating with a monitoring sensor adapted for use at a monitored store, wherein the monitoring sensor is an electronic sensor adapted to generate monitored data in a digital format, wherein the monitored data indicate an inventory level measurement at a measurement time for the monitored store; and wherein the electronic sensor is adapted to communicate via a communication device that is adapted to transmit the monitored data from the electronic sensor to a computing device; and
executing a computer program product, wherein the computer program product is adapted to be stored on a non-transitory machine-readable medium of the computing device and includes computer instructions that are executable using a processor of the computing device that, when executed by the processor, cause the processor to execute a computer-implemented method for estimating the correlation between the corresponding time and the corresponding inventory level of the unmonitored store as of the corresponding time;
wherein the computer-implemented method includes capabilities of:
receiving monitored data generated using the monitoring sensor providing the inventory level measurement at the measurement time for the monitored store;
receiving unmonitored data associated with the unmonitored store, wherein the unmonitored data indicate a historical corresponding inventory level as of a historical corresponding time for the unmonitored store;
generating a model to estimate the correlation between the corresponding inventory level and the corresponding time of the unmonitored store based at least on the monitored data and the unmonitored data;
estimating the correlation between the corresponding inventory level and the corresponding time for the unmonitored store based on the model; and
estimating the inventory parameter of the unmonitored store based on the model;
wherein estimating the inventory parameter of the unmonitored store includes using the correlation between the corresponding inventory level and the corresponding time of the unmonitored store to estimate a corresponding inventory level estimate of the unmonitored store for a specified time, to estimate a corresponding time estimate for a specified inventory level of the unmonitored store, or to estimate the corresponding inventory level estimate for the specified time and to estimate the corresponding time estimate for the specified inventory level;
wherein the monitored store and the unmonitored store share similarities in store configuration, store inventory, and inventory depletion, whereby these similarities enable the unmonitored store to be compared with the monitored store for purposes of estimating the inventory parameter of the unmonitored store, in which a measured inventory parameter of the monitored store may be extrapolated or interpolated to generate an estimated inventory parameter of the unmonitored store;

wherein the monitored store comprises a store that includes the monitoring sensor;

wherein the unmonitored store comprises a store that does not include an electronic sensor adapted to generate the unmonitored data and transmit the unmonitored data to the computing device; and wherein the unmonitored data are not generated by an electronic sensor in communication with the computing device and transmitted to the computing device.

12. The method according to claim 11, wherein:
the unmonitored data comprise a historical resupply time for the unmonitored store and a historical inventory level measurement for the unmonitored store as of the historical resupply time.

13. The method according to claim 11, wherein:
the computer-implemented method further comprises:
receiving the monitored data measured by the monitoring sensor at a first frequency; and
receiving the unmonitored data obtained at a second frequency, in which the second frequency is lower than the first frequency.

14. The method according to claim 11, wherein:
the model comprises a first model and a second model; and the generating comprises:
generating the first model for a first seasonal time period, and generating the second model for a second seasonal time period,
in which the second seasonal time period is different from the first seasonal time period.

15. The method according to claim 11, wherein:
the computer-implemented method further comprises:
receiving updated unmonitored data associated with the unmonitored store; and
updating the model based on the updated unmonitored data, wherein the model is updated to more accurately estimate the correlation between the corresponding inventory level and the corresponding time for the unmonitored store based on the model updated based on the updated unmonitored data.

16. The method according to claim 15, wherein:
the computer-implemented method further comprises:
estimating an inventory consumption rate for the unmonitored store.

17. The method according to claim 11, wherein:
the computer-implemented method further comprises:
receiving updated monitored data generated using the monitoring sensor associated with the monitored store; and
updating the model based on the updated monitored data, wherein the model is updated to more accurately estimate the correlation between the corresponding inventory level and the corresponding time for the unmonitored store based on the model updated based on the updated monitored data.

18. The method according to claim 17, wherein:
the updated monitored data comprise a most recent inventory level measurement for the monitored store.

19. The method according to claim 11, wherein:
the computer-implemented method further comprises:
estimating the corresponding inventory level estimate of the unmonitored store for the specified time.

20. The method according to claim 11, wherein:
the computer-implemented method further comprises:
estimating the corresponding time estimate for the specified inventory level of the unmonitored store.

21. A computer program product for estimating an inventory parameter of an unmonitored store based on a correlation between a corresponding time and a corresponding inventory level of the unmonitored store as of the corresponding time, wherein the computer program product is adapted to be stored on a non-transitory machine-readable medium of a computing device, the computer program product comprising:

computer instructions that are executable using a processor of the computing device that, when executed by the processor, cause the processor to execute a computer-implemented method for estimating the correlation between the corresponding time and the corresponding inventory level of the unmonitored store as of the corresponding time;

wherein the computer-implemented method includes capabilities of:
communicating with a monitored store having a monitoring sensor adapted for use at the monitored store, wherein the monitoring sensor is an electronic sensor adapted to generate monitored data in a digital format, wherein the monitored data indicate an inventory level measurement at a measurement time for the monitored store; and wherein the electronic sensor is adapted to communicate via a communication device that is adapted to transmit the monitored data from the electronic sensor to the computing device;
receiving monitored data generated using the monitoring sensor providing the inventory level measurement at the measurement time for the monitored store;
receiving unmonitored data associated with the unmonitored store, wherein the unmonitored data indicate a historical corresponding inventory level as of a historical corresponding time for the unmonitored store;
generating a model to estimate the correlation between the corresponding inventory level and the corresponding time of the unmonitored store based at least on the monitored data and the unmonitored data;
estimating the correlation between the corresponding inventory level and the corresponding time for the unmonitored store based on the model; and
estimating the inventory parameter of the unmonitored store based on the model;

wherein estimating the inventory parameter of the unmonitored store includes using the correlation between the corresponding inventory level and the corresponding time of the unmonitored store to estimate a corresponding inventory level estimate of the unmonitored store for a specified time, to estimate a corresponding time estimate for a specified inventory level of the unmonitored store, or to estimate the corresponding inventory level estimate for the specified time and to estimate the corresponding time estimate for the specified inventory level;

wherein the monitored store and the unmonitored store share similarities in store configuration, store inventory, and inventory depletion, whereby these similarities enable the unmonitored store to be compared with the monitored store for purposes of estimating the inventory parameter of the unmonitored store, in which a measured inventory parameter of the monitored store may be extrapolated or interpolated to generate an estimated inventory parameter of the unmonitored store;

wherein the monitored store comprises a store that includes the monitoring sensor;

wherein the unmonitored store comprises a store that does not include an electronic sensor adapted to generate the unmonitored data and transmit the unmonitored data to the computing device; and wherein the unmonitored data are not generated by an electronic sensor in communication with the computing device and transmitted to the computing device.

22. A method for estimating an inventory parameter of an unmonitored store based on a correlation between a corresponding time and a corresponding inventory level of the unmonitored store as of the corresponding time, the method comprising:

communicating with a monitoring sensor adapted for use at a monitored store, wherein the monitoring sensor is an electronic sensor adapted to generate monitored data in a digital format, wherein the monitored data indicate an inventory level measurement at a measurement time for the monitored store; and wherein the electronic sensor is adapted to communicate via a communication device that is adapted to transmit the monitored data from the electronic sensor to a computing device; and executing a computer program product, wherein the computer program product is adapted to be stored on a non-transitory machine-readable medium of the computing device and includes computer instructions that are executable using a processor of the computing device that, when executed by the processor, cause the processor to execute a computer-implemented method for estimating the correlation between the corresponding time and the corresponding inventory level of the unmonitored store as of the corresponding time;

wherein the computer-implemented method includes capabilities of:

receiving monitored data generated using the monitoring sensor providing the inventory level measurement at the measurement time for the monitored store;

receiving unmonitored data associated with the unmonitored store, wherein the unmonitored data indicate a historical corresponding inventory level as of a historical corresponding time for the unmonitored store;

filtering the monitored data by a monitored data filter to remove any non-compliant monitored data that do not meet a monitored data filter requirement of the monitored data;

providing to a computing environment any compliant monitored data, in which compliant monitored data comprise monitored data that pass the monitored data filter, after meeting each monitored data filter requirement, and after removing non-compliant monitored data;

filtering the unmonitored data by an unmonitored data filter to remove any non-compliant unmonitored data that do not meet an unmonitored data filter requirement of the unmonitored data;

providing to the computing environment any compliant unmonitored data, in which compliant unmonitored data comprise unmonitored data that pass the unmonitored data filter, after meeting each unmonitored data filter requirement, and after removing non-compliant unmonitored data;

collecting the compliant monitored data and the compliant unmonitored data in the computing environment for purposes of comparing any non-blocked compliant monitored data and any non-blocked compliant unmonitored data;

blocking comparison of a corresponding dataset of compliant monitored data and compliant unmonitored data by a blocking module in the computing environment, in which the blocking module blocks comparison of any blocked corresponding dataset of any blocked compliant unmonitored data and any blocked compliant unmonitored data that does not meet a blocking module requirement of the corresponding dataset of the compliant monitored data and the compliant unmonitored data, and in which the blocking module does not block comparison of any non-blocked corresponding dataset of any non-blocked compliant unmonitored data and any non-blocked compliant unmonitored data that does meet each blocking module requirement of the corresponding dataset of the compliant monitored data and the compliant unmonitored data;

computing an overlapped event history as a factor of the correlation by a computation module in the computing environment, in which the overlapped event history is computed by comparing the non-blocked corresponding dataset of the non-blocked compliant monitoring data and the non-blocked compliant unmonitored data;

storing each overlapped event history as overlapped event history data in an overlapped event history database in the computing environment, in which the overlapped event history data and the overlapped event history database are available for use in subsequent steps of the method, including any repeated steps of the method; and generating a model to estimate the correlation between the corresponding inventory level and the corresponding time of the unmonitored store based at least on the overlapped event history data and on the non-blocked corresponding datasets of the non-blocked compliant monitored data and the non-blocked compliant unmonitored data;

estimating the correlation between the corresponding inventory level and the corresponding time for the unmonitored store based on the model; and estimating the inventory parameter of the unmonitored store based on the model;

wherein estimating the inventory parameter of the unmonitored store includes using the correlation between the corresponding inventory level and the corresponding time of the unmonitored store to estimate a corresponding inventory level estimate of the unmonitored store for a specified time, to estimate a corresponding time estimate for a specified inventory level of the unmonitored store, or to estimate the corresponding inventory level estimate for the specified time and to estimate the corresponding time estimate for the specified inventory level;

wherein the blocking module is adapted to confirm that the monitored store and the unmonitored store share similarities in store configuration, store inventory, and inventory events, whereby these similarities enable the unmonitored store to be compared with the monitored store for purposes of estimating the inventory parameter of the unmonitored store, in which a measured inventory parameter of the monitored store may be extrapolated or interpolated to generate an estimated inventory parameter of the unmonitored store;

wherein the monitored store comprises a store that includes the monitoring sensor;

wherein the unmonitored store comprises a store that does not include an electronic sensor adapted to generate the unmonitored data and transmit the unmonitored data to the computing device; and wherein the unmonitored data are not generated by an electronic sensor in communication with the computing device and transmitted to the computing device.

23. The method according to claim 22, wherein:

the computing environment comprises a parallelization employing parallel processing or distributed computing.

* * * * *

UNITED STATES PATENT AND TRADEMARK OFFICE
CERTIFICATE OF CORRECTION

Page 1 of 1

PATENT NO. : 12,198,095 B2
APPLICATION NO. : 17/350766
DATED : January 14, 2025
INVENTOR(S) : Theodore Trebaol et al.

It is certified that error appears in the above-identified patent and that said Letters Patent is hereby corrected as shown below:

In the Drawings

Sheet 3, Figure 3, the "3/2" under the arrow for the Fuel Level 322 component should instead read as "2/3."

Signed and Sealed this
Twenty-fifth Day of February, 2025

Coke Morgan Stewart
*Acting Director of the United States Patent and Trademark Office*